(12) United States Patent
Sato et al.

(10) Patent No.: US 10,658,147 B2
(45) Date of Patent: *May 19, 2020

(54) CHARGED PARTICLE BEAM APPARATUS

(71) Applicant: HITACHI HIGH-TECH SCIENCE CORPORATION, Minato-ku, Tokyo (JP)

(72) Inventors: Makoto Sato, Tokyo (JP); Satoshi Tomimatsu, Tokyo (JP); Atsushi Uemoto, Tokyo (JP); Tatsuya Asahata, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 173 days.

This patent is subject to a terminal disclaimer.

(21) Appl. No.: 15/468,290

(22) Filed: Mar. 24, 2017

(65) Prior Publication Data

US 2017/0278664 A1    Sep. 28, 2017

(30) Foreign Application Priority Data

Mar. 25, 2016 (JP) ................. 2016-062672

(51) Int. Cl.
*H01J 37/02* (2006.01)
*H01J 37/20* (2006.01)

(52) U.S. Cl.
CPC ............ *H01J 37/023* (2013.01); *H01J 37/20* (2013.01)

(58) Field of Classification Search
CPC ........... H01J 37/023; H01J 37/20; H01J 37/26

USPC .......... 250/442.11, 306, 307, 309, 310, 311, 250/492.1, 492.2, 492.3
See application file for complete search history.

(56) References Cited

U.S. PATENT DOCUMENTS

| 5,270,552 | A | 12/1993 | Ohnishi et al. ............... 250/307 |
| 9,620,333 | B2 * | 4/2017 | Tomimatsu ......... H01J 37/3023 |
| 2017/0122852 | A1 | 5/2017 | Uemoto et al. |
| 2019/0025167 | A1 | 1/2019 | Uemoto et al. |

FOREIGN PATENT DOCUMENTS

| JP | 5052721 | 3/1993 |
| JP | 2000171364 | 6/2000 |
| JP | 2008153239 | 7/2008 |
| WO | 2016 002719 | 1/2016 |

* cited by examiner

*Primary Examiner* — Nicole M Ippolito
*Assistant Examiner* — Hanway Chang
(74) *Attorney, Agent, or Firm* — Adams & Wilks

(57) ABSTRACT

A charged particle beam apparatus which automatically prepares a sample piece from a sample, includes: a charged particle beam irradiation optical system configured to perform irradiation of a charged particle beam; a sample stage configured to move, the sample being placed on the sample stage; a sample piece relocation unit configured to hold and transport the sample piece which is separated and picked up from the sample; a holder fixing stage which holds a sample piece holder to which the sample piece is relocated; and a computer which performs positional control in relation to a target object based on a template and positional information which is obtained from an image of the target object, the template being generated based on an absorption current image of the target object which is acquired using the irradiation of the charged particle beam.

7 Claims, 23 Drawing Sheets

CHARGED PARTICLE BEAM APPARATUS

CROSS REFERENCE TO RELATED APPLICATION

This application is based upon and claims the benefit of priority of Japanese Patent Application No. 2016-062672 filed on Mar. 25, 2016, the contents of which are incorporated herein by reference in its entirety.

BACKGROUND

The present invention relates to a charged particle beam apparatus.

In the related art, there is known an apparatus which picks up a sample piece which is prepared by irradiating a sample with a charged particle beam which is formed of electrons or ions, and which processes the sample piece into a shape suitable for various processes such as observation, analysis and measurement by a scanning electron microscope and a transmission electron microscope (for example, refer to JP-A-5-052721 and JP-A-2008-153239).

In the related art, there is known an apparatus which picks up a sample piece which is prepared by irradiating a sample with a focused ion beam using a needle installed inside the apparatus, and which uses an image (also referred to as an absorption current image or an inflow current image) from an ion beam current which flows into the needle for clarifying a tip position of the needle when processing the sample piece into a shape suitable for various processes such as observation, analysis and measurement by a scanning electron microscope, a transmission electron microscope, or the like (for example, refer to JP-A-2000-171364). In this apparatus, in a case in which the surface of the sample is a complicated shape such as a semiconductor device pattern, since it is often not possible to recognize the tip position of the needle due to the influence of the shape of the surface of the sample in a secondary electron image, it is possible to effectively use the absorption current image.

In the present specification, "sampling" refers to picking up a sample piece which is prepared by irradiating a sample with a charged particle beam and processing the sample piece into a shape suitable for various processes such as observation, analysis, and measurement. More specifically, "sampling" refers to relocating a sample piece which is formed from a sample by processing with a focused ion beam to a sample piece holder.

In the related art, it cannot be said that the technology which is capable of automatically sampling the sample piece is sufficiently realized.

Examples of causes of obstructing of the automatic and continuous repetition of the sampling include that it is not possible to automatically perform image recognition of the needle which is used for picking up and transporting the sample piece, and the tip of the needle being molded or the needle itself being exchanged accompanying a deformation of the tip of the needle, and the like.

The reason that image recognition of the needle may not be automatically performed is that in a case in which the tip position of the needle is checked using an electron beam, a needle tip member may not be distinguished from the background image in the secondary electron image (or the reflected electron image), and the image recognition of the tip of the needle may not be performed, an incorrect image may be extracted, or the image recognition process may be stopped.

When checking the tip position of the needle using the absorption current image of the charged particle beam, when the secondary electron yield of the needle tip material is close to 1, the tip of the needle may not be distinguished from the background image, and the tip of the needle may not be confirmed. For example, although it is possible to confirm a tungsten needle using an absorption current image, when a carbon deposition film remains at the tip of the tungsten needle, it is not possible to perform image recognition on the carbon deposition film in the absorption current image, and there is a case in which, where the tip of the remaining carbon deposition film is to be determined to be the tip of the needle, instead, since the carbon deposition film is not formed, the tip of the tungsten needle may be erroneously recognized as the true tip. In such a state, when the needle is caused to approach a delicate sample piece, where the needle is to be stopped directly before the sample piece, instead a residue of the carbon deposition film which remains at the tip of the needle collides with the delicate sample piece.

In this manner, it is not possible to cause the true tip of the needle which includes the carbon deposition film to move to a target position using the image. In the worst case, the needle collides with the sample piece and destroys the sample piece, causing a problem of losing a valuable sample. Due to the collision of the needle with the sample piece, the needle is deformed, and a state is assumed in which the needle must be exchanged. Such a situation inhibits the automatic and continuous repetition of the sampling which is the original purpose.

SUMMARY

The present invention is made in view of the above circumstances, and an object thereof is to provide a charged particle beam apparatus which is capable of automatically and repeatedly executing an operation of picking up a sample piece which is formed by processing a sample using an ion beam and relocating the sample piece to a sample piece holder.

An aspect of the present disclosure provides the following configuration:

a charged particle beam apparatus which automatically prepares a sample piece from a sample, the charged particle beam apparatus comprising:

a charged particle beam irradiation optical system configured to perform irradiation of a charged particle beam;

a sample stage configured to move, the sample being placed on the sample stage;

a sample piece relocation unit configured to hold and transport the sample piece which is separated and picked up from the sample;

a holder fixing stage which holds a sample piece holder to which the sample piece is relocated; and a computer which performs positional control in relation to a target object based on a template and positional information which is obtained from an image of the target object, the template being generated based on an absorption current image of the target object which is acquired using the irradiation of the charged particle beam.

According to the charged particle beam apparatus of the present invention, since it is possible to accurately subject the tip of the needle to image recognition, accurate positional control of the needle becomes possible, and it is possible to automatically and continuously execute a sampling operation in which a sample piece which is formed by processing of the sample using an ion beam is picked up and relocated to a sample piece holder.

BRIEF DESCRIPTION OF THE DRAWINGS

FIG. 6A is a schematic diagram explaining the true tip of the needle, and FIG. 6B is a schematic diagram explaining a first image which is obtained using an absorption current signal.

FIG. 7A is a schematic diagram illustrating a second image in which a region which is brighter than a background is extracted, and FIG. 7B is a schematic diagram illustrating a third image in which a region which is darker than the background is extracted.

DESCRIPTION OF ILLUSTRATIVE EMBODIMENTS

Hereinafter, a charged particle beam apparatus which is capable of automatically preparing a sample piece according to the embodiment of the present invention will be described with reference to the accompanying drawings.

Figure 1:
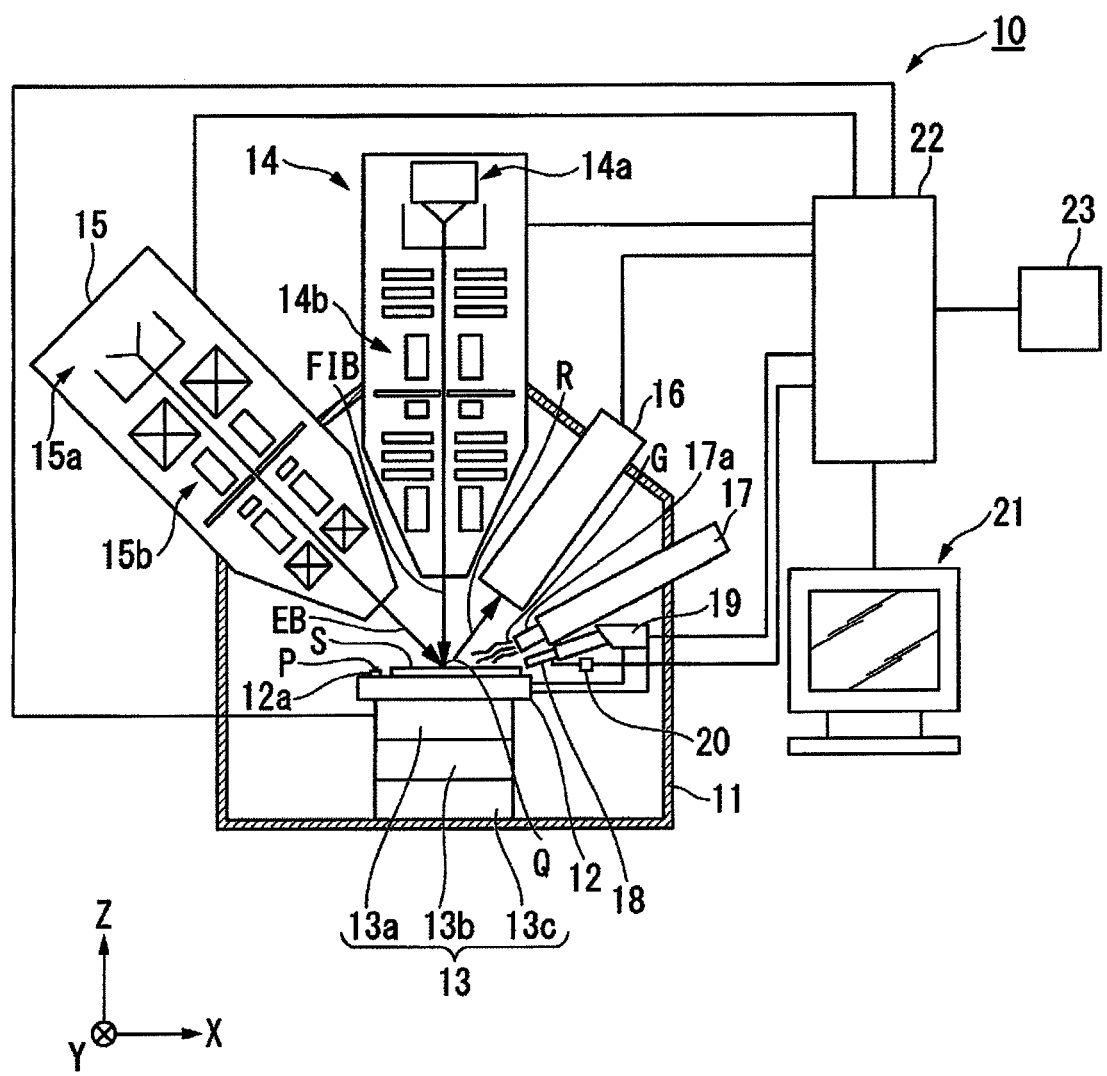
FIG. 1 is a configuration diagram of a charged particle beam apparatus according to an embodiment of the present invention.

FIG. 1 is a configuration diagram of a charged particle beam apparatus 10 according to the embodiment of the present invention. As illustrated in FIG. 1, the charged particle beam apparatus 10 according to the embodiment of the present invention is provided with a sample chamber 11 which is capable of maintaining the inner portion of the sample chamber 11 in a vacuum state, a stage 12 to which it is possible to fix a sample S and a sample piece holder P in the inner portion of the sample chamber 11, and a stage drive mechanism 13 which drives the stage 12. The charged particle beam apparatus 10 includes a focused ion beam irradiation optical system 14 which irradiates an irradiation target within a predetermined irradiation region (that is, a scanning range) in the inner portion of the sample chamber 11 with a focused ion beam (FIB). The charged particle beam apparatus 10 is provided with an electron beam irradiation optical system 15 which irradiates the irradiation target within a predetermined irradiation region in the inner portion of the sample chamber 11 with an electron beam (EB). The charged particle beam apparatus 10 is provided with a detector 16 which detects secondary charged particles (secondary electrons, secondary ions) R which are emitted from the irradiation target due to the irradiation target being irradiated with the focused ion beam or the electron beam. The charged particle beam apparatus 10 is provided with a gas supply unit 17 which supplies a gas G to the surface of the irradiation target. Specifically, the gas supply unit 17 is a nozzle 17a or the like with an outer diameter of approximately 200 μm. The charged particle beam apparatus 10 is provided with a needle 18 which picks up a minute sample piece Q from the sample S which is fixed to the stage 12, holds the sample piece Q, and relocates the sample piece Q to the sample piece holder P, a needle drive mechanism 19 which drives the needle 18 to transport the sample piece Q, and an absorption current detector 20 which detects the inflow current (also referred to as absorption current) of the charged particle beam which flows into the needle 18, transmits the inflow current signal to a computer, and forms an image from the inflow current signal.

The needle 18 and the needle drive mechanism 19 may be collectively referred to as a sample piece relocation unit. The charged particle beam apparatus 10 is provided with a display device 21 which displays image data based on the secondary charged particles R which are detected by the detector 16, a computer 22, and an input device 23.

The irradiation targets of the focused ion beam irradiation optical system 14 and the electron beam irradiation optical system 15 are the sample S and the sample piece Q which are fixed to the stage 12, the needle 18 and the sample piece holder P which are present in the irradiation region, and the like.

The charged particle beam apparatus 10 according to the embodiment irradiates the surface of the irradiation target while scanning a focused ion beam, and thus, it is possible to execute various types of processing (digging, trimming processing, and the like) by image formation and sputtering of an irradiated portion, formation of a deposition film, and the like. The charged particle beam apparatus 10 is capable of executing a process of forming the sample piece Q (for example, a thinned sample, a needle-shaped sample, or the like) for transmission observation by a transmission electron microscope from the sample S, and an analysis sample piece using an electron beam. The charged particle beam apparatus 10 is capable of executing processing which makes the sample piece Q which is relocated to the sample piece holder P into a thin film which has a desired thickness (for example, 5 nm to 100 nm, or the like) which is suitable for transmission observation by a transmission electron microscope. The charged particle beam apparatus 10 is capable of executing observation of the surface of the irradiation target by irradiating the surface of the irradiation targets such as the sample piece Q and the needle 18 while scanning the focused ion beam or the electron beam.

The absorption current detector 20 is provided with a preamplifier, amplifies the inflow current of the needle, and transmits the amplified inflow current to the computer 22. Using the needle inflow current which is detected by the absorption current detector 20 and a signal which is synchronized with the scanning of the charged particle beam, it is possible to display a needle shape absorption current image on the display device 21, and it is possible to perform identification of the shape and the tip position of the needle.

Figure 2:
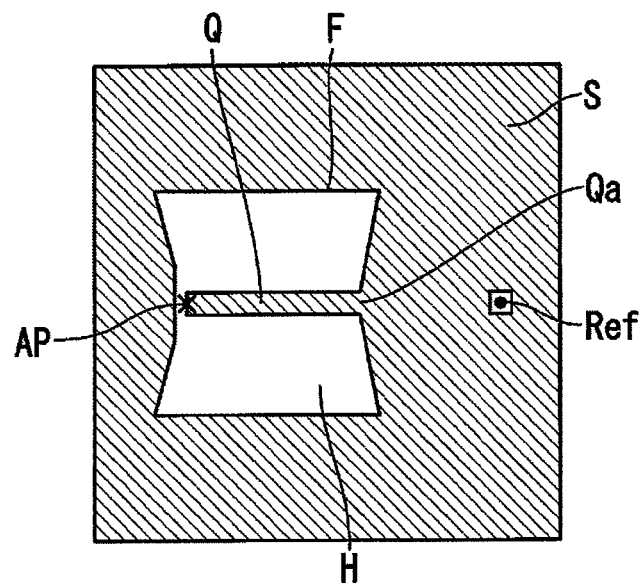
FIG. 2 is a plan view illustrating a sample piece which is formed in a sample of a charged particle beam apparatus according to the embodiment of the present invention.

FIG. 2 is a plan view illustrating the sample piece Q which is formed by irradiating the surface (the shaded portion) of the sample S with a focused ion beam, before the sample piece Q is picked up from the sample S in the charged particle beam apparatus 10 according to the embodiment of the present invention. A symbol F indicates a processing frame by the focused ion beam, that is, a scanning range of the focused ion beam, and illustrates a processing region H which is cut by sputtering the inside (the white portion) of the scanning range by focused ion beam irradiation. A symbol Ref is a reference mark (a reference point) indicating the position at which to form (leave without cutting) the sample piece Q, is a shape which is formed by providing a fine hole with a diameter of 30 nm, for example, in a deposition film (for example, a shape where a side is 1 μm) which is described later using a focused ion beam, or the like, and it is possible to recognize the reference mark in an image by the focused ion beam or the electron beam with favorable contrast. The deposition film is used to ascertain the approximate position of the sample piece Q, and the fine hole is used in precise alignment. In the sample S, the sample piece Q is etched such that the peripheral portion on the side portion side and the bottom portion side are scraped away and eliminated to leave a support portion Qa which is connected to the sample S, and the sample S is supported by the support portion Qa in a cantilever fashion. The dimension of the sample piece Q in the longitudinal direction is, for example, approximately 10 μm, 15 μm, or 20 μm, and the width (thickness) is a minute sample piece of approximately 500 nm, 1 μm, 2 μm, or 3 μm, for example.

The sample chamber 11 is configured to be capable of evacuating the inner portion to a desired vacuum state using an exhaust device (not illustrated) and to be capable of maintaining the desired vacuum state.

The stage 12 holds the sample S. The stage 12 is provided with a holder fixing stage 12*a* which holds the sample piece holder P. The holder fixing stage 12*a* may have a structure in which it is possible to mount a plurality of the sample piece holders P.

Figure 3:
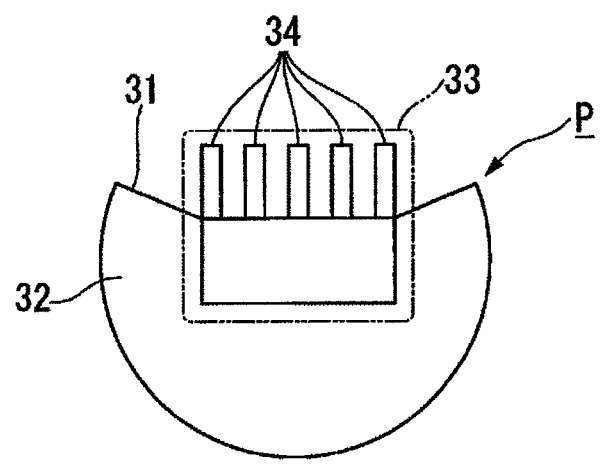
FIG. 3 is a plan view illustrating the sample piece holder of the charged particle beam apparatus according to the embodiment of the present invention.
Figure 4:
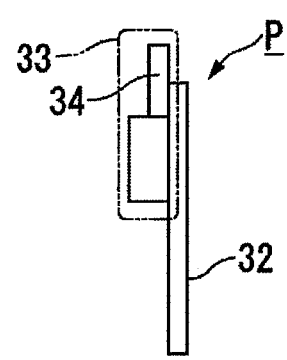
FIG. 4 is a side view illustrating the sample piece holder of the charged particle beam apparatus according to the embodiment of the present invention.

FIG. 3 is a plan view of the sample piece holder P, and FIG. 4 is a side view. The sample piece holder P is provided with a substantially semicircular plate-shaped base portion 32 which includes a cutout portion 31, and a sample stage 33 which is fixed to the cutout portion 31. The base portion 32 is formed of, for example, metal in the form of a circular plate having a diameter of 3 mm and a thickness of 50 μm. The sample stage 33 is formed from, for example, a silicon wafer by a semiconductor manufacturing process, and is attached to the cutout portion 31 using a conductive adhesive. The sample stage 33 has a comb teeth shape, and is provided with a plurality of (for example, 5, 10, 15, 20, or the like) columnar portions (hereinafter also referred to as pillars) 34 which are disposed to be spaced apart and onto which the sample piece Q is relocated. By making the widths of the columnar portions 34 different from each other, the image of the sample piece Q which is relocated to each of the columnar portions 34 and the image of the columnar portion 34 are associated with each other and are further stored in the computer 22 in association with the associated sample piece holder P. Therefore, even in a case in which a large number of sample pieces Q is prepared from a single sample S, it is possible to recognize a large number of sample pieces Q from a single sample S without mistake, and it is possible to perform subsequent analysis of the transmission electron microscope or the like with the corresponding sample piece Q and the pickup location on the sample S correlated without mistake. Each of the columnar portions 34 is formed to have a tip portion thickness of, for example, less than or equal to 10 μm, less than or equal to 5 μm, or the like, and holds the sample piece Q which is attached to the tip portion.

The base portion 32 is not limited to the circular plate shape having the diameter of 3 mm and the thickness of 50 μm as described above, and, for example, may be a rectangular plate shape having a length of 5 mm, a height of 2 mm, a thickness of 50 μm, or the like. In summary, the shape of the base portion 32 is a shape that can be mounted on the stage 12 to be introduced into a subsequent transmission electron microscope, and may be a shape such that all of the sample pieces Q which are mounted on the sample stage 33 are positioned within the movable range of the stage 12. According to the base portion 32 which has this shape, it is possible to observe all of the sample pieces Q which are mounted on the sample stage 33 with a transmission electron microscope.

The stage drive mechanism 13 is housed in the inner portion of the sample chamber 11 in a state of being connected to the stage 12, and displaces the stage 12 with respect to a predetermined axis in accordance with a control signal which is output from the computer 22. The stage drive mechanism 13 is provided with a moving mechanism 13*a* which moves the stage 12 in parallel along at least the X axis and the Y axis that are parallel to a horizontal plane and are orthogonal to each other and the Z axis in the vertical direction which is orthogonal to the X axis and the Y axis. The stage drive mechanism 13 is provided with a tilt mechanism 13*b* which tilts the stage 12 around the X axis or the Y axis, and a rotation mechanism 13*c* which rotates the stage 12 around the Z axis.

The focused ion beam irradiation optical system 14 causes a beam emitting portion (not illustrated) in the inner portion of the sample chamber 11 to face the stage 12 at a position above the stage 12 in the vertical direction within the irradiation region, and the optical axis is rendered parallel to the vertical direction and is fixed to the sample chamber 11. Accordingly, it is possible to irradiate an irradiation target such as the sample S and the sample piece Q which are placed on the stage 12, and the needle 18 which is present in the irradiation region with a focused ion beam facing downward from above the irradiation target in the vertical direction. The charged particle beam apparatus 10 may be provided with another ion beam irradiation optical system instead of the focused ion beam irradiation optical system 14 which is described above. The ion beam irradiation optical system is not limited to an optical system which forms a focused beam as described above. The ion beam irradiation optical system may be, for example, a projection type ion beam irradiation optical system in which a stencil mask which includes a standard opening in the optical system is installed, and which forms a shaped beam having an opening shape of the stencil mask. According to the projection type ion beam irradiation optical system, it is possible to precisely form a molding beam of a shape corresponding to the processing region of the periphery of the sample piece Q, and the processing time is shortened.

The focused ion beam irradiation optical system 14 is provided with an ion source 14a which generates ions, and an ion optical system 14b which focuses and deflects the ions which are extracted from the ion source 14a. The ion source 14a and the ion optical system 14b are controlled in accordance with control signals which are output from the computer 22, and the irradiation position, the irradiation conditions, and the like of the focused ion beam are controlled by the computer 22. The ion source 14a is, for example, a liquid metal ion source using liquid gallium or the like, a plasma ion source, a gas field ionization ion source, or the like. The ion optical system 14b is provided with, for example, a first electrostatic lens such as a condenser lens, an electrostatic deflector, a second electrostatic lens such as an objective lens, and the like. In the case in which a plasma ion source is used as the ion source 14a, it is possible to realize high-speed processing using a large current beam, and is suitable for picking up a large sample S.

The electron beam irradiation optical system 15 causes a beam emitting portion (not illustrated) in the inner portion of the sample chamber 11 to face the stage 12 tilted by a predetermined angle (for example, 60°) in the tilt direction in relation to the vertical direction of the stage 12 within the irradiation region, and the optical axis is rendered parallel to the tilt direction and is fixed to the sample chamber 11. Accordingly, it is possible to irradiate an irradiation target such as the sample S and the sample piece Q which are fixed to the stage 12, and the needle 18 which is present in the irradiation region with an electron beam facing downward from above the irradiation target in the tilt direction.

The electron beam irradiation optical system 15 is provided with an electron source 15a which generates electrons, and an electron optical system 15b which focuses and deflects the electrons which are emitted from the electron source 15a. The electron source 15a and the electron optical system 15b are controlled in accordance with control signals which are output from the computer 22, and the irradiation position, the irradiation conditions, and the like of the electron beam are controlled by the computer 22. The electron optical system 15b is provided with an electromagnetic lens, a deflector, and the like, for example.

The disposition of the electron beam irradiation optical system 15 and the focused ion beam irradiation optical system 14 is switched, the electron beam irradiation optical system 15 may be disposed in the vertical direction, and the focused ion beam irradiation optical system 14 may be disposed in the tilt direction which is tilted by a predetermined angle in the vertical direction The detector 16 detects the intensity (that is, the amount of secondary charged particles) of the secondary charged particles (secondary electrons and secondary ions) R which are radiated from the irradiation target when the irradiation target such as the sample S and the needle 18 is irradiated with the focused ion beam or the electron beam, and outputs information of the detected amount of the secondary charged particles R. The detector 16 is disposed at a position at which it is possible to detect the amount of the secondary charged particles R in the inner portion of the sample chamber 11, for example, at a position obliquely above the irradiation target such as the sample S in the irradiation region, and is fixed to the sample chamber 11.

The gas supply unit 17 is fixed to the sample chamber 11, includes a gas ejection unit (also referred to as a nozzle) in the inner portion of the sample chamber 11, and is disposed to face the stage 12. The gas supply unit 17 is capable of supplying, to the sample S, an etching gas for selectively promoting etching of the sample S with the focused ion beam according to the material of the sample S, a deposition gas for forming a deposition film using deposits such as metals or insulators on the surface of the sample S, and the like. For example, it is possible to promote the etching in a manner in which the material is selected by supplying an etching gas to the sample S together with the irradiation of a focused ion beam. Examples of the etching gas include as xenon fluoride to a silicon-based sample S and water to an organic sample S. For example, it is possible to deposit a solid component which is decomposed from the deposition gas on the surface of the sample S (deposition) by supplying a deposition gas containing platinum, carbon, tungsten or the like to the sample S together with the irradiation of the focused ion beam. Specific examples of the deposition gas include phenanthrene, naphthalene and pyrene as carbon-containing gases, trimethyl.ethylcyclopentadienyl.platinum as a platinum-containing gas, and tungsten hexacarbonyl as a tungsten-containing gas. Depending on the supply gas, it is possible to perform the etching and the deposition by irradiating with an electron beam. However, the deposition gas in the charged particle beam apparatus 10 of the present invention is a deposition gas containing carbon, for example, most suitably phenanthrene, naphthalene, pyrene, or the like, from the viewpoint of the deposition speed, and the reliable adhesion of the deposition film between the sample piece Q and the needle 18, and one of these gases is used.

The needle drive mechanism 19 is housed in the inner portion of the sample chamber 11 in a state of the needle 18 being connected thereto, and displaces the needle 18 in accordance with a control signal which is output from the computer 22. The needle drive mechanism 19 is provided integrally with the stage 12 and moves integrally with the stage 12 when, for example, the stage 12 is caused to rotate around the tilt axis (that is, the X axis or the Y axis) by the tilt mechanism 13b. The needle drive mechanism 19 is provided with a moving mechanism (not illustrated) which moves the needle 18 in parallel along each of the three-dimensional coordinate axes, and a rotation mechanism (not illustrated) which rotates the needle 18 around the center axis of the needle 18. The three-dimensional coordinate axes are an orthogonal triaxial coordinate system which is independent of the orthogonal triaxial coordinate system of the sample stage and uses two-dimensional coordinate axes which are parallel to the surface of the stage 12, and in a case in which the surface of the stage 12 is in a tilted state or a rotated state, this coordinate system tilts and rotates.

The computer 22 controls at least the stage drive mechanism 13, the focused ion beam irradiation optical system 14, the electron beam irradiation optical system 15, the gas supply unit 17, and the needle drive mechanism 19.

The computer 22 is disposed outside the sample chamber 11, and is connected to the display device 21 and the input device 23 such as a mouse or a keyboard which outputs a signal according to the input operation of an operator.

The computer 22 integrally controls the operations of the charged particle beam apparatus 10 based on a signal which is output from the input device 23, a signal which is generated by a preset automatic operation control process, or the like.

The computer 22 converts the detected amount of the secondary charged particles R which are detected by the detector 16 while scanning the irradiation position of the charged particle beam to a luminance signal associated with the irradiation position, and generates image data indicating the shape of the irradiation target from the two-dimensional position distribution of the detected amount of the secondary charged particles R. In the absorption current image mode, by detecting the absorption current flowing in the needle 18 while scanning the irradiation position of the charged particle beam, the computer 22 generates the absorption current image data indicating the shape of the needle 18 using the two-dimensional position distribution (the absorption current image) of the absorption current. The computer 22 causes the display device 21 to display screens for executing operations such as enlargement, reduction, movement, and rotation of each item of the image data, together with each item of the generated image data. The computer 22 causes the display device 21 to display screens for performing various settings such as mode selection and processing settings in automatic sequence control.

Incidentally, the computer 22 includes memory storing a computer readable program and a processor (CPU) which executes the computer readable program to cause the charged particle beam apparatus 10 to function as follows. The memory may include a RAM, ROM, hard disk, combination thereof, etc.

The charged particle beam apparatus 10 according to the embodiment of the present invention is provided with the configuration which is described above, and next, description will be given of the operations of the charged particle beam apparatus 10.

Hereinafter, sequential description will be given of the operations of automatic sampling which is executed by the computer 22, that is, the operation of automatically relocating the sample piece Q which is formed by the processing of the sample S by the charged particle beam (the focused ion beam) to the sample piece holder P, largely divided into the initialization process, the sample piece pickup process, and the sample piece mounting process.

<Initialization Process>

Figure 5:
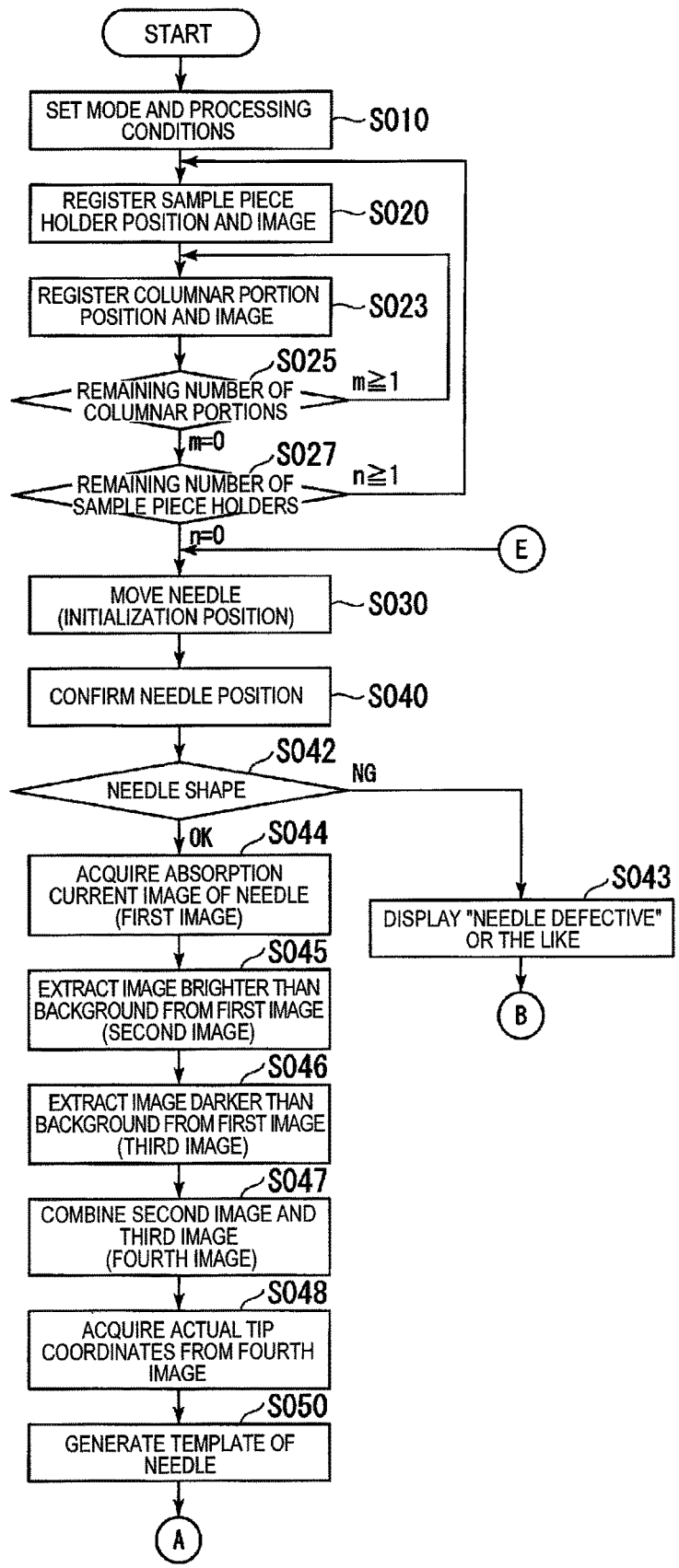
FIG. 5 is a flowchart specifically of an initialization process among flowcharts which illustrate the operations of the charged particle beam apparatus according to the embodiment of the present invention.

FIG. 5 is a flowchart illustrating the initialization process among the operations of automatic sampling by the charged particle beam apparatus 10 according to the embodiment of the present invention. First, at the start of the automatic sequence corresponding to the input of the operator, the computer 22 performs mode selection of whether or not to use a posture control mode to be described later, setting of observation conditions for template matching and processing conditions (settings of processing position, dimensions, number, and the like), confirmation of the tip shape of the needle and the like (step S010).

Next, the computer 22 generates templates of the columnar portions 34 (step S020 to step S027). In the template creation, first, the computer 22 subjects the sample piece holder P which is installed on the holder fixing stage 12a of the stage 12 by the operator to a position registration process (step S020). The computer 22 generates the templates of the columnar portions 34 at the beginning of the sampling process. The computer 22 generates a template for each of the columnar portions 34. The computer 22 does not perform stage coordinate acquisition and template creation of each of the columnar portions 34, stores the stage coordinates and the templates in sets, and subsequently use the sets when determining the shapes of the columnar portions 34 by template matching (template and image superimposition). The computer 22 stores, for example, the image itself, edge information which is extracted from the image, and the like in advance as a template of the columnar portion 34 which is used for template matching. The computer 22 is capable of recognizing the accurate position of the columnar portion 34 by performing the template matching after the movement of the stage 12 in a later process and determining the shape of the columnar portion 34 according to the score of the template matching. It is preferable to use observation conditions such as contrast and magnification which are the same as those for template creation as the observation conditions for the template matching since it is possible to perform accurate template matching.

In a case in which a plurality of the sample piece holders P are installed on the holder fixing stage 12a and a plurality of the columnar portions 34 are provided in each of the sample piece holders P, a recognition code which is unique to each of the sample piece holders P and a recognition code which is unique to each of the columnar portions 34 of the corresponding sample piece holders P may be predefined, and the recognition codes, the coordinates of each of the columnar portions 34, and the template information may be associated with each other and stored in the computer 22.

The computer 22 may store the coordinates of the part (the picked up portion) from which the sample piece Q in the sample S is picked up and the image information of the peripheral sample surface as a set together with the recognition codes, the coordinates of each of the columnar portions 34, and the template information.

For example, in the case of irregular samples such as rocks, minerals, and biological samples, the computer 22 may set a low magnification wide visual field image, position coordinates of the picked up portion, images, and the like in sets, and may store the information of the sets as recognition information. The recognition information may be associated with the thinned sample S, or may be recorded in association with the transmission electron microscope image and the pickup position of the sample S.

The computer 22 performs the position registration process of the sample piece holder P prior to the movement of the sample piece Q to be described later, and thus, it is possible to confirm in advance that the sample stage 33 which actually has a suitable shape is present.

In the position registration process, first, the computer 22 moves the stage 12 using the stage drive mechanism 13 as a rough adjustment operation, and aligns the irradiation region with the position to which the sample stage 33 is attached in the sample piece holder P. Next, as a fine adjustment operation, the computer 22 generates a template from the design shape (CAD information) of the sample stage 33 in advance from each item of image data which is generated by the irradiation of the charged particle beam (each of the focused ion beam and the electron beam) and extracts the positions of the plurality of columnar portions 34 which configure the sample stage 33 using the template which is formed. The computer 22 subjects the position coordinates and the image, which are extracted for each of the columnar portions 34, to the registration process (storage) as the attachment position of the sample piece Q (step S023). At this time, the images of each of the columnar portions 34 are compared with the design drawing of the columnar portion, the CAD drawing, or an image of a standard product of the columnar portion 34 which are prepared beforehand, the presence or absence of deformation, chipping, missing portions, or the like of each of the columnar portions 34 is confirmed, and if the columnar portion 34 is defective, the computer 22 also stores that the columnar portion 34 is a defective product together with the coordinate position and the image of the columnar portion 34.

Next, it is determined whether or not there are columnar portions 34 to be registered in the sample piece holder P which is currently undergoing the registration process (step S025). In a case in which the determination result is "NO", that is, in a case in which a remaining number m of the columnar portions 34 to be registered is greater than or equal to 1, the process returns to step S023 which is described above, and step S023 and S025 are repeated until the remaining number m of the columnar portions 34 is depleted. On the other hand, in a case in which the determination result is "YES", that is, in a case in which the remaining number m of the columnar portions 34 to be registered is zero, the process advances to step S027.

In a case in which a plurality of the sample piece holders P are installed on the holder fixing stage 12*a*, the position coordinates of each of the sample piece holders P, and the image data of the corresponding sample piece holder P are recorded together with the code number for each of the sample piece holders P, and the like, and further, the position coordinates of each of the columnar portions 34 of each of the sample piece holders P, the associated code number, and the image data are stored (registered). The computer 22 may sequentially carry out the position registration process by the number of sample pieces Q on which to carry out the automatic sampling.

The computer 22 determines whether or not there are any sample piece holders P to be registered (step S027). In a case in which the determination result is "NO", that is, in a case in which a remaining number n of the sample piece holders P to be registered is greater than or equal to 1, the process returns to step S020 which is described above, and step S020 to S027 are repeated until the remaining number n of the sample piece holders P is depleted. On the other hand, in a case in which the determination result is "YES", that is, in a case in which the remaining number n of the sample piece holders P to be registered is zero, the process advances to step S030.

Accordingly, in a case in which several tens of the sample pieces Q are to be automatically prepared from a single sample S, since the positions of a plurality of the sample piece holders P are registered in the holder fixing stage 12*a* and the positions of the respective columnar portions 34 are image-registered, it is possible to call a specific sample piece holder P to which the several tens of sample pieces Q are to be attached and a specific columnar portion 34 within the visual field of the charged particle beam instantaneously.

In the position registration process (steps S020 and S023), in a case in which, by some small chance, the sample piece holder P itself or the columnar portion 34 is deformed or broken and is not in a state in which the sample piece Q may be attached, "unusable" (notation indicating that the sample piece Q may not be attached) or the like is also registered in association with the position coordinates, the image data, and the code number. As a result, the computer 22 is capable of skipping the sample piece holder P or the columnar portion 34 which is "unusable" when relocating the sample piece Q, which is described later, and moving the next of the sample piece holders P or the columnar portions 34 which is normal within the observation visual field.

Next, the computer 22 generates a template of the needle 18 (step S030 to step S050). The template is used for image matching when accurately causing a needle, which is described later, to approach the sample piece.

In the template creation process, first, the computer 22 moves the stage 12 once using the stage drive mechanism 13. Subsequently, the computer 22 moves the needle 18 to the initialization position using the needle drive mechanism 19 (step S030). The initialization position is a point (a coincidence point) at which the focused ion beam and the electron beam are capable of irradiating approximately the same point and at which the focal points of both beams meet, and is a predefined position at which there are no complex structures which may be erroneously recognized as the sample S, the needle 18, or the like in the background of the needle 18 due to stage movement which is performed directly prior. The coincidence point is a position at which it is possible to observe the same target object from different angles using the focused ion beam irradiation and the electron beam irradiation.

Next, the computer 22 recognizes the position of the needle 18 according to the absorption image mode by electron beam irradiation (step S040).

By irradiating the needle 18 while scanning the electron beam, the computer 22 detects the absorption current flowing into the needle 18 and generates absorption current, image data. At this time, since there is no background which is erroneously recognized as the needle 18 in the absorption current image, it is possible to recognize the needle 18 without being affected by the background image. The computer 22 acquires the absorption current image data using the irradiation of the electron beam. The reason why the template is generated using the absorption current image is that when the needle approaches the sample piece, since many shapes which may be erroneously recognized as the needle are present in the background of needle, such as the processed shape of the sample piece and the pattern of the sample surface, there is a high risk of erroneous recognition in the secondary electron image, and the absorption current image which is not affected by the background is used to prevent erroneous recognition. The secondary electron image is easily affected by the background image, and is not suitable as a template image because of the high possibility of erroneous recognition. In this manner, since the carbon deposition film at the tip of the needle may not be recognized in the absorption current image, the true tip of the needle may not be ascertained; however, the absorption current image is suitable from the viewpoint of pattern matching with the template.

Here, the computer 22 determines the shape of the needle 18 (step S042).

Figure 20:
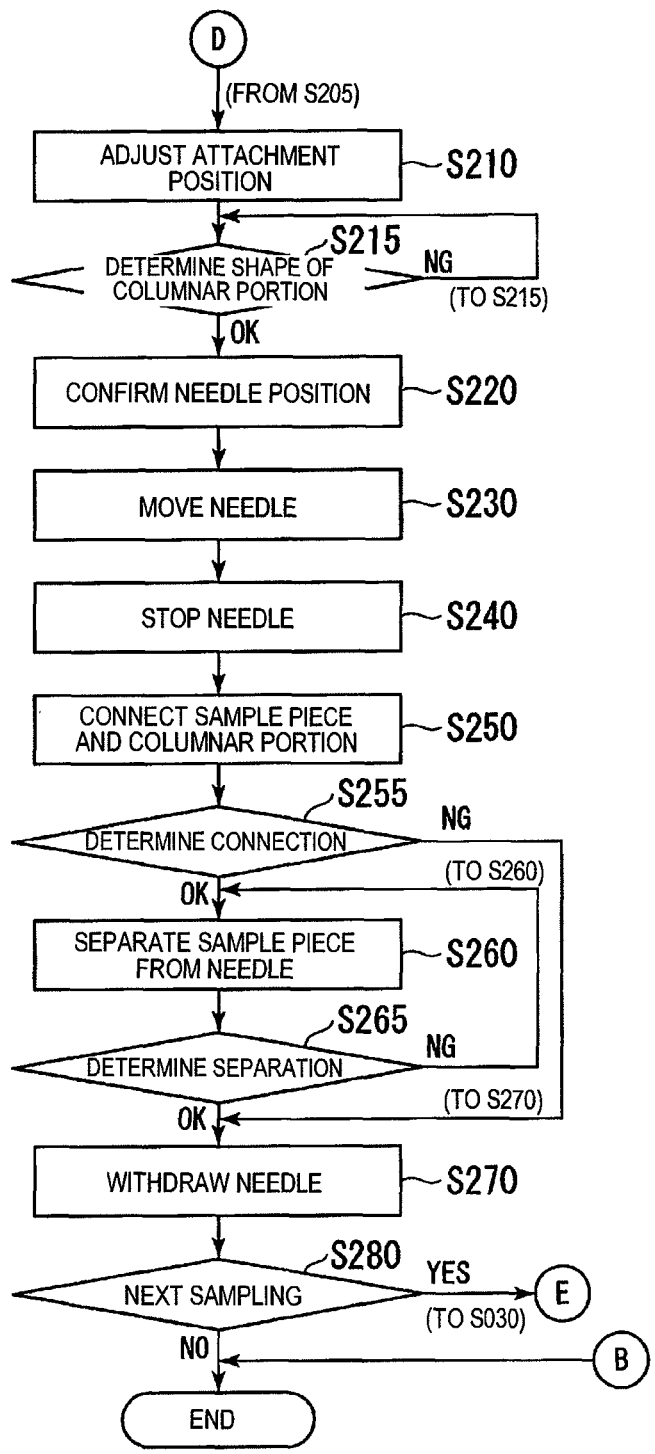
FIG. 20 is a flowchart specifically of a sample piece mounting process among the flowcharts which illustrate the operations of the charged particle beam apparatus according to the embodiment of the present invention.

In a case in which, by some small chance, the shape of the tip of the needle 18 is not in a state in which the sample piece Q may be attached due to deformation, breakage, or the like (NG in step S042), the process jumps from step S043 to step S300 of FIG. 20, and the automatic sampling operations are terminated without executing all of the steps from step S050 onward. In other words, in a case in which the shape of the tip of the needle is defective, the work hereon may not be executed, and the work of exchanging needles which is carried out by an apparatus operator is started. In the determination of the shape of the needle in step S042, for example, in a case in which the position of the tip of the needle is shifted by greater than or equal to 100 μm from a predetermined position in an observation visual field of 200 μm on one side, the shape of the needle is determined to be a defective product. In step S042, in a case in which it is determined that the shape of the needle is defective, "needle defective" or the like is displayed on the display device 21 (step S043), and the operator of the apparatus is warned. The needle 18 which is determined to be a defective product may be exchanged for a new needle 18 or, if the defect is slight, the tip of the needle may be molded using focused ion beam irradiation.

In step S042, if the needle 18 is a normal shape which is predefined, the process advances to the next step S044.

Here, description will be given of the state of the tip of the needle.

Figure 6A:
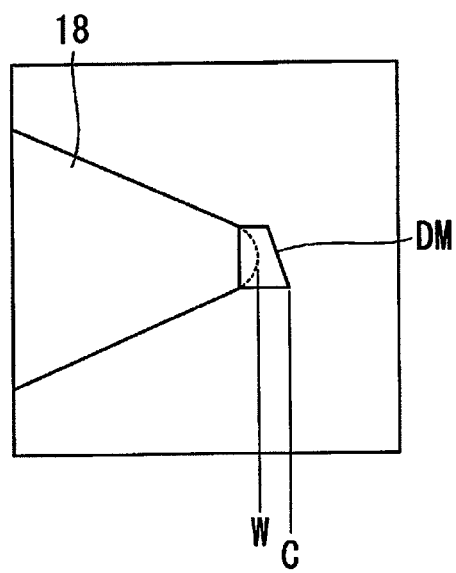
FIGS. 6A and 6B are schematic diagrams for explaining a true tip of a needle which is used repeatedly in the charged particle beam apparatus according to the embodiment of the present invention, and in particular.

FIG. 6A is a schematic diagram in which the tip portion of the needle is enlarged in order to explain a state in which the residue of a carbon deposition film DM which is adhered to the tip of the needle 18 (a tungsten needle). Since the tip of the needle 18 is repetitively subjected to a sampling operation a plurality of times such that the tip is not deformed by being irradiated and cut with the focused ion beam, a residue of the carbon deposition film DM which holds the sample piece Q is adhered to the tip of the needle 18. By repeating the sampling, the residue of the carbon deposition film DM gradually increases in size, and becomes a shape which protrudes slightly beyond the tip position of the tungsten needle. Therefore, the true tip coordinates of the needle 18 are not a tip W of the tungsten which configures the original needle 18 but a tip C of the residue of the carbon deposition film DM. The reason why the template is generated using the absorption current image is that when the needle approaches the sample piece, since many shapes which may be erroneously recognized as the needle are present in the background of needle, such as the processed shape of the sample piece and the pattern of the sample surface, there is a high risk of erroneous recognition in the secondary electron image, and the absorption current image which is not affected by the background is used to prevent erroneous recognition. The secondary electron image is easily affected by the background image, and is not suitable as a template image because of the high possibility of erroneous recognition. In this manner, since the carbon deposition film at the tip of the needle may not be recognized in the absorption current image, the true tip of the needle may not be ascertained; however, the absorption current image is suitable from the viewpoint of pattern matching with the template.

Figure 6B:
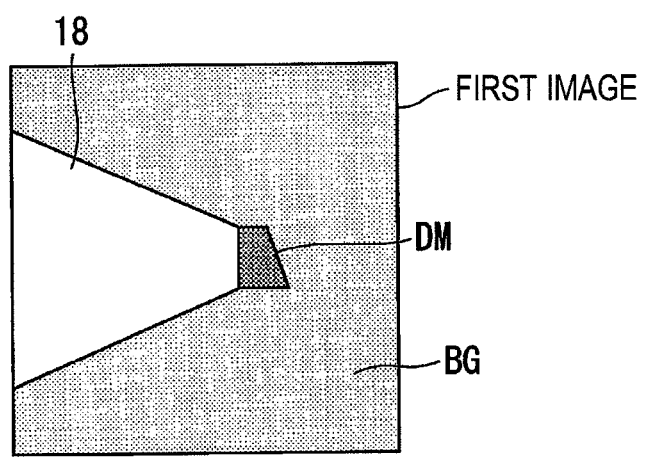

FIG. 6B is a schematic diagram of an absorption current image of the tip portion of the needle to which the carbon deposition film is adhered. Even if there is a complicated pattern in the background, it is possible to clearly recognize the needle without being affected by the background shape. Since the signal of the electron beam with which the background is irradiated is not reflected in the image, the background is depicted as a gray tone with a uniform noise level. On the other hand, the carbon deposition film appears a little darker than the gray tone of the background, and it is found that the tip of the carbon deposition film may not be clearly confirmed in the absorption current image. In the absorption current image, since it is not possible to recognize the true position of the needle including the carbon deposition film, when the needle is moved relying on only the absorption current image, there is a high possibility that the tip of the needle will collide with the sample piece.

Therefore, the coordinates of the tip C of the carbon deposition film obtain the true tip coordinates of the needle as follows. Here, the image of FIG. 6B is referred to as a first image.

A process of acquiring the absorption current image (the first image) of the needle is step S044.

Next, the first image of FIG. 6B is subjected to image processing, and a region which is brighter than the background is extracted. (Step S045)

Figure 7A:
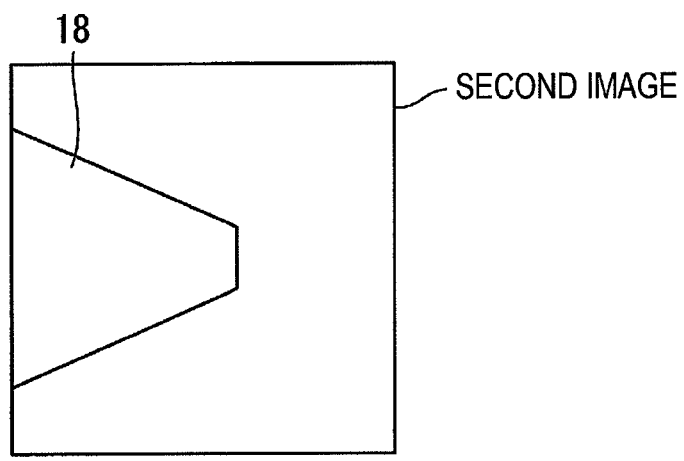
FIGS. 7A and 7B are schematic diagrams of a secondary electron image obtained through electron beam irradiation of the tip of the needle in the charged particle beam apparatus according to the embodiment of the present invention, and in particular.

FIG. 7A is a schematic diagram in which the first image of FIG. 6B is subjected to image processing and a region which is brighter than the background is extracted. When the difference in brightness between the background and the needle is small, the image contrast may be increased to increase the difference in brightness between the background and the needle. In this manner, an image emphasizing a region (a portion of the needle 18) which is brighter than the background is obtained, and the image is referred to as a second image here. The second image is stored in the computer.

Next, a region which is darker than the brightness of the background is extracted in the first image of FIG. 6B. (Step S046)

Figure 7B:
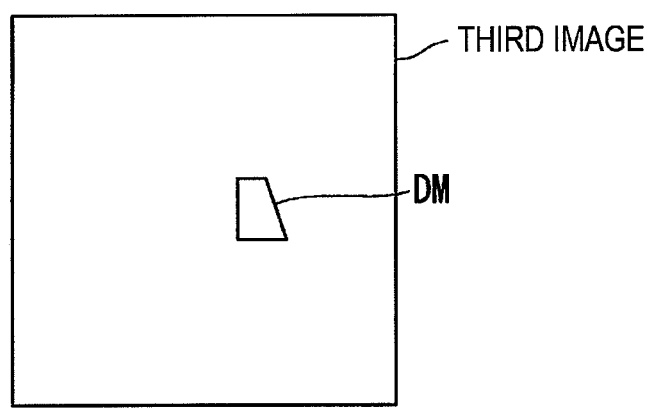

FIG. 7B is a schematic diagram in which the first image of FIG. 6B is subjected to image processing and a region which is darker than the background is extracted. Only the carbon deposition film of the tip of the needle is extracted and displayed. When the difference in brightness between the background and the carbon deposition film is small, the image contrast may be increased to increase the difference in brightness between the background and the carbon deposition film on the image data. In this manner, an image in which the region which is darker than the background is rendered apparent is obtained. Here, the image is referred to as a third image, and the third image is stored in the computer.

Next, the second image and the third image which are stored in the computer are combined. (Step S047)

Figure 8:
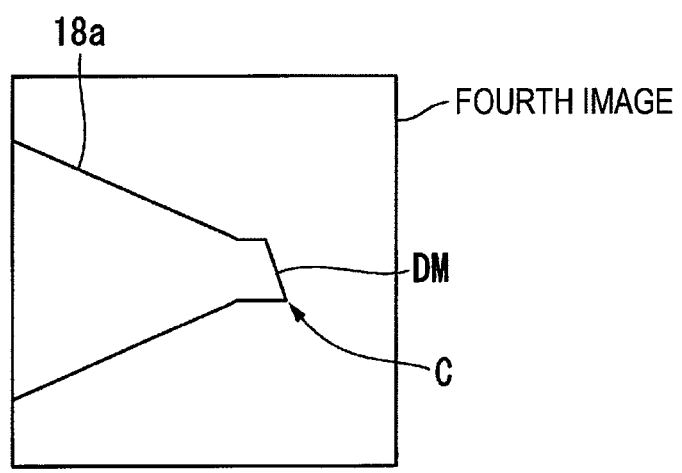
FIG. 8 is a schematic diagram explaining a fourth image in which the second image and the third image of FIGS. 7A and 7B are combined.

FIG. 8 is a schematic diagram of the display image after combination. However, in order to render the image easy to view, only the contour of the needle region in the second image and the contour of the carbon deposition film portion in the third image is displayed as a line the background, the needle and areas other than the outer periphery of the deposition film may be displayed transparently, or alternatively, only the background may be rendered transparent, and the needle and the carbon deposition film may be displayed with the same color or the same tone. As described above, since the second image and the third image are originally based on the first image, as long as only one of the second image and the third image is not subjected to a deformation such as scaling, rotation, or the like, the image which is obtained through the combination is a shape reflecting the first image. Here, the combined image is referred to as a fourth image, and the fourth image is stored in the computer. Since the fourth image is subjected to the process of adjusting the contrast and emphasizing the contour based on the first image, the needle shapes of the first image and the fourth image are exactly the same, the outline is clear, and the tip of the carbon deposition film becomes clear as compared with the first image.

Next, from the fourth image, the tip of the carbon deposition film, that is, the true tip coordinates of the needle on which the deposition film is deposited is determined. (Step S048)

The fourth image is retrieved from the computer and displayed, and the true tip coordinates of the needle are obtained. The location which protrudes most in the axial direction of the needle is the true tip C of the needle, the tip coordinates are automatically determined by image recognition and are stored in the computer.

Next, in order to further increase the precision of the template matching, the template image is obtained by extracting only a portion of the reference image data containing the tip of the needle with reference to the tip coordinates of the needle which are obtained in step S048, and the template image is registered in the computer 22 in association with the reference coordinates of the tip of the needle which are obtained in step S050.

Next, the computer 22 performs the following processing as a process of causing the needle 18 to approach the sample piece Q.

In step S050, the configuration is limited to the same observation visual field; however, the configuration is not limited thereto, and as long as the reference of the beam scanning may be managed, the configuration is not limited to the same visual field. In the above description of step S050, the template includes the tip portion of the needle; however, as long as the coordinates are associated with the reference coordinates, a region not containing the tip may be used as a template. Although the secondary electron image is given as an example in FIGS. 7A and 7B, the reflected electron image may also be used for identifying the coordinates of the tip C of the carbon deposition film DM.

Since the computer 22 uses the image data which is actually acquired before moving the needle 18 as the reference image data, it is possible to perform pattern matching with high precision regardless of the difference in the shape of the individual needles 18. Since the computer 22 acquires each item of image data in a state in which there are no complex structures in the background, it is possible to obtain accurate true tip coordinates of the needle. It is possible to acquire a template from which it is possible to clearly ascertain the shape of the needle 18 excluding the influence of the background.

When acquiring each item of image data, the computer 22 uses image acquisition conditions such as suitable magnification, luminance, contrast, and the like which are stored in advance in order to increase the recognition precision of the target object.

The process of generating the template of the columnar portion 34 which is described above (S020 to S027) and the process of generating the template of the needle 18 (S030 to S050) may be reversed. However, in a case in which the process of generating the template of the needle 18 (S030 to S050) is performed first, the flow (E) which returns from step S280 (described later) also follows.

Sample Piece Pickup Process

Figure 9:
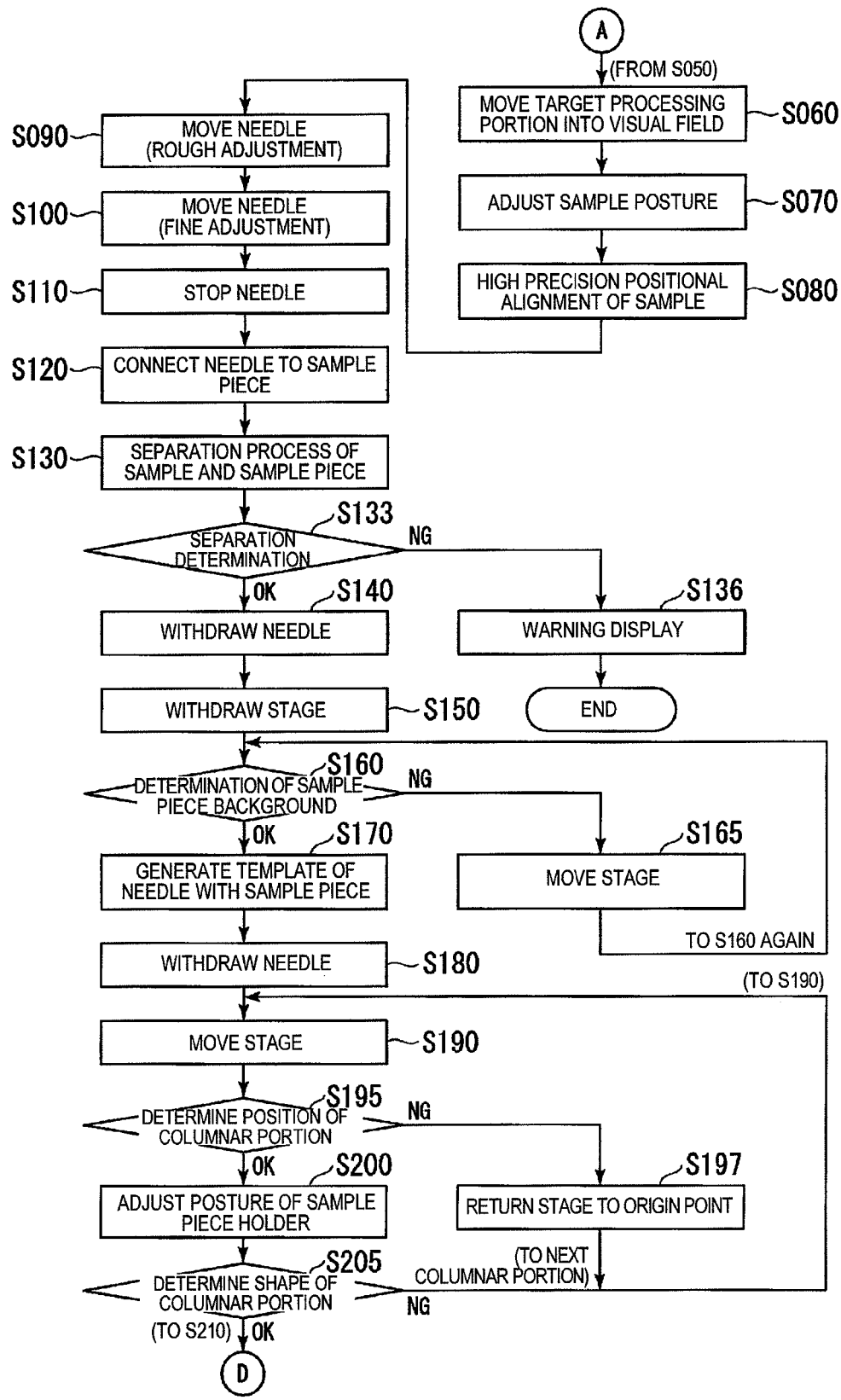
FIG. 9 is a flowchart specifically of a sample piece pickup process among the flowcharts which illustrate the operations of the charged particle beam apparatus according to the embodiment of the present invention.

FIG. 9 is a flowchart illustrating the pickup process of picking up the sample piece Q from the sample S among the operations of automatic sampling by the charged particle beam apparatus 10 according to the embodiment of the present invention. Here, pickup refers to separating the sample piece Q from the sample S through processing by the focused ion beam or using the needle, and picking up the sample piece Q.

First, the computer 22 moves the stage 12 using the stage drive mechanism 13 in order to place the target sample piece Q in the visual field of the charged particle beam. The stage drive mechanism 13 may be operated using the position coordinates of the target reference mark Ref.

Next, the computer 22 recognizes the reference mark Ref, which is formed in advance in the sample S, using the image data of the charged particle beam. Using the recognized reference mark Ref, the computer 22 recognizes the position of the sample piece Q from the relative positional relationship between the known reference mark Ref and the sample piece Q, and moves the stage such that the position of the sample piece Q enters the observation visual field (step S060).

Next, the computer 22 drives the stage 12 using the stage drive mechanism 13, and rotates the stage 12 around the Z axis by an angle which is associated with the posture control mode such that the posture of the sample piece Q becomes a predetermined posture (for example, a posture suitable for picking up by the needle 18, or the like) (step S070).

Next, the computer 22 recognizes the reference mark Ref using the image data of the charged particle beam, recognizes the position of the sample piece Q from the relative positional relationship between the known reference mark Ref and the sample piece Q, and performs alignment of the sample piece Q (step S080). Next, the computer 22 performs the following processing as a process of causing the needle 18 to approach the sample piece Q.

The computer 22 executes a needle movement (coarse adjustment) in which the needle 18 is moved by the needle drive mechanism 19 (step S090). The computer 22 recognizes the reference mark Ref (refer to FIG. 2 which is described above) using each item of image data of the focused ion beam and the electron beam with respect to the sample S. The computer 22 sets a movement target position AP of the needle 18 using the recognized reference mark Ref.

Here, the movement target position AP is a position which is close to the sample piece Q. The movement target position AP is, for example, a position which is close to the side portion of the opposite side from the support portion Qa of the sample piece Q. The computer 22 associates the movement target position AP with a predetermined positional relationship with respect to a processing frame F when the sample piece Q is formed. The computer 22 stores information of the relative positional relationship between the processing frame F and the reference mark Ref when forming the sample piece Q in the sample S using irradiation of the focused ion beam. Using the recognized reference mark Ref, the computer 22 uses the relative positional relationship between the reference mark Ref, the processing frame F, and the movement target position AP (refer to FIG. 2) to move the tip position of the needle 18 toward the movement target position AP in three-dimensional space. When the needle 18 is three-dimensionally moved, the computer 22 first moves the needle 18 in the X direction and the Y direction, and next moves the needle 18 in the Z direction.

When the needle 18 is moved, the computer 22 observes the electron beam and the focused ion beam from different directions by using the reference mark Ref which is formed on the sample S during the execution of the automatic processing in which the sample piece Q is formed, and thus, it is possible to precisely ascertain the three-dimensional positional relationship between the needle 18 and the sample piece Q, and it is possible to move the needle 18 in a suitable manner.

In the processing described above, the computer 22 uses the reference mark Ref to move the position of the tip of the needle 18 toward the movement target position AP in three-dimensional space by using the relative positional relationship between the reference mark Ref, the processing frame F, and the movement target position AP; however, the configuration is not limited thereto. Without using the processing frame F, the computer 22 may move the tip position of the needle 18 toward the movement target position AP in three-dimensional space using the relative positional relationship between the reference mark Ref and the movement target position AP.

Next, the computer 22 executes a needle movement (fine adjustment) in which the needle 18 is moved by the needle drive mechanism 19 (step S100). The computer 22 repeats the pattern matching which uses the template which is generated in step S050 and uses the tip coordinates of the needle which are obtained in step S047 as the tip position of the needle 18 in the SEM image to move the needle 18 from the movement target position AP to a connection processing position in three-dimensional space in a state in which the irradiation region containing the movement target position AP is irradiated with the charged particle beam.

Next, the computer 22 performs a process of stopping the movement of the needle 18 (step S110).

Figure 10:
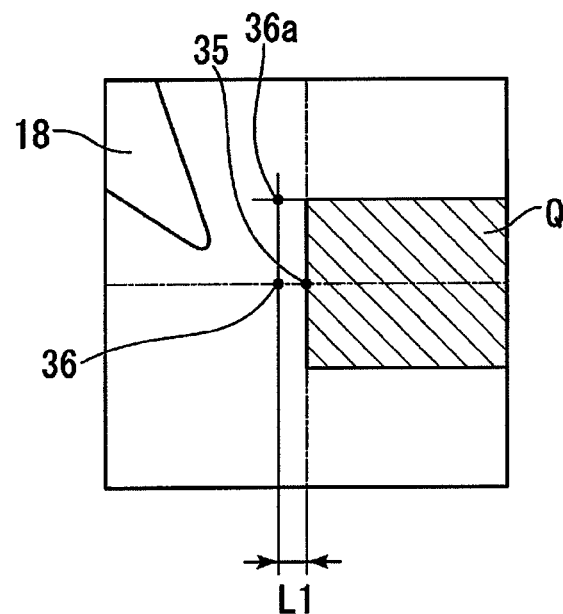
FIG. 10 is a schematic diagram for explaining a stopping position of the needle when connecting the needle to the sample piece in the charged particle beam apparatus according to the embodiment of the present invention.

FIG. 10 is a diagram for explaining the positional relationship when the needle is connected to the sample piece, and is a diagram in which the end portion of the sample piece Q is enlarged. In FIG. 10, the end portion (cross section) of the sample piece Q to which the needle 18 is to be connected is disposed at a SIM image center 35, and a position separated from the SIM image center 35 over a predetermined distance L1, for example, at the center of the width of the sample piece Q is used as a connection processing position 36. The connection processing position may be a position on an extension (symbol 36a of FIG. 10) of the end surface of the sample piece Q. In this case, connection processing position becomes a convenient position to which the deposition film easily adheres. The computer 22 sets the upper limit of the predetermined distance L1 to 1 μm, and preferably sets the predetermined interval to a range from 100 nm to 400 nm. When the predetermined interval is less than 100 nm, in the following processes, it is not possible to only cut the deposition film which is connected when the needle 18 and the sample piece are Q separated, and there is a high risk of also cutting the needle 18. When the needle 18 is cut, the needle 18 is shortened and the tip of the needle is deformed to become thicker. When the cutting is repeated, the needle 18 is to be exchanged, which goes against an object of the present invention which is to perform the sampling automatically and repeatedly. Conversely, when the predetermined interval exceeds 400 nm, the connection by the deposition film becomes insufficient and the risk of failing to pick up the sample piece Q increases which hinders the repeated sampling.

Although the position in the depth direction is not visible from FIG. 10, for example, the position in the depth direction is predefined as a position of ½ the width of the sample piece Q. However, the depth direction is not limited to this position. The three-dimensional coordinates of the connection processing position 36 are stored in the computer 22.

The computer 22 specifies the connection processing position 36 which is preset. The computer 22 operates the needle drive mechanism 19 based on the three-dimensional coordinates of the tip of the needle 18 and the connection processing position 36 in the same SIM image or SEM image, and moves the needle 18 to the predetermined connection processing position 36. The computer 22 stops the needle drive mechanism 19 when the tip of the needle coincides with the connection processing position 36.

Figure 11:
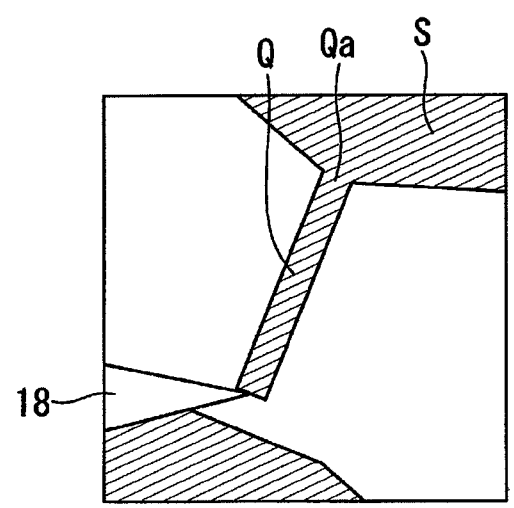
FIG. 11 is a diagram illustrating the tip of the needle and the sample piece in an image which is obtained using a focused ion beam of the charged particle beam apparatus according to the embodiment of the present invention.
Figure 12:
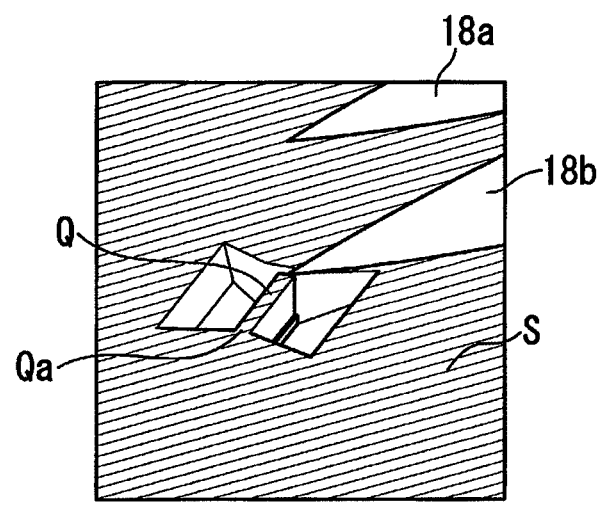
FIG. 12 is a diagram illustrating the tip of the needle and the sample piece in an image which is obtained using an electron beam of the charged particle beam apparatus according to the embodiment of the present invention.

FIGS. 11 and 12 illustrate the manner in which the needle 18 approaches the sample piece Q. FIG. 11 illustrates an image which is obtained using the focused ion beam of the charged particle beam apparatus 10 according to the embodiment of the present invention, and FIG. 12 illustrates an image which is obtained using the electron beam. FIG. 12 illustrates the state before and after the fine adjustment of the needle, a needle 18a in FIG. 12 depicts the needle 18 at the movement target position, a needle 18b depicts the needle 18 which is moved to the connection processing position 36 after the fine adjustment of the needle 18, and the needles 18a and 18b are the same needle 18. FIGS. 11 and 12 illustrate that the observation magnification is different in addition to that the observation direction is different between the focused ion beam and the electron beam; however, the observation target and the needle 18 are the same.

According to this method of moving the needle 18, it is possible to precisely and swiftly cause the needle 18 to approach and stop at the connection processing position 36 in the vicinity of the sample piece Q.

Next, the computer 22 performs a process of connecting the needle 18 to the sample piece Q (step S120). The computer 22 irradiates the irradiation region, which contains the processing frame R1 which is set at the connection processing position 36, with the focused ion beam while supplying a carbon-based gas which is the deposition gas to the front end surface of the sample piece Q and the tip surface of the needle 18 for a predetermined time using the gas supply unit 17. Accordingly, the computer 22 connects the sample piece Q and the needle 18 using the deposition film.

Figure 13:
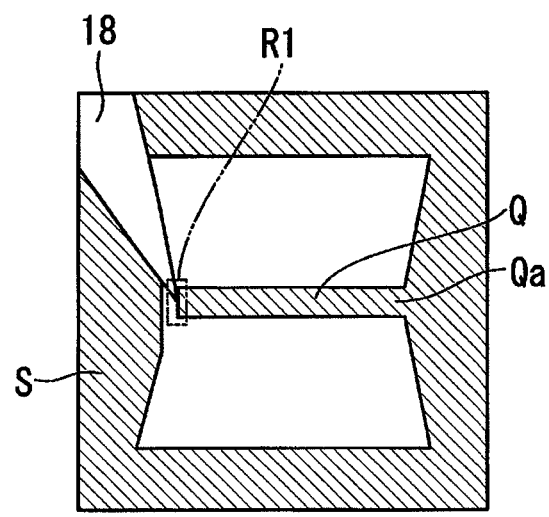
FIG. 13 is a diagram illustrating a processing frame which contains the needle and a connection processing position of the sample piece in an image which is obtained using a focused ion beam of the charged particle beam apparatus according to the embodiment of the present invention.
Figure 14:
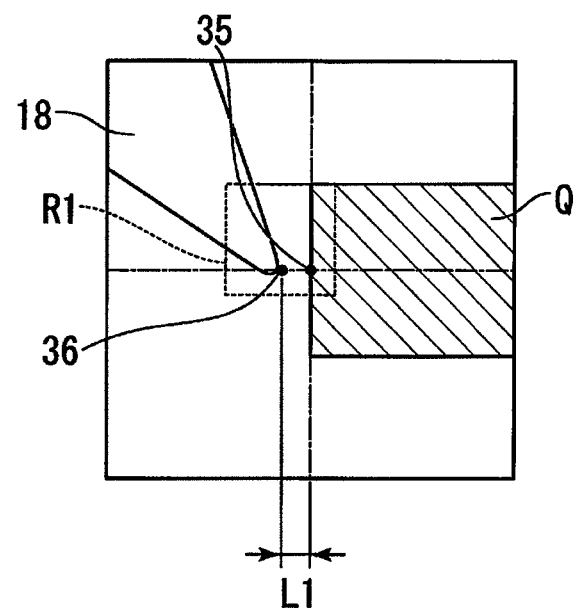
FIG. 14 is a schematic diagram for explaining a positional relationship between the needle and the sample piece when the needle is connected to the sample piece in the charged particle beam apparatus according to the embodiment of the present invention.

In step S120, since the computer 22 connects the needle 18 using the deposition film at a position spaced apart without causing the needle 18 to directly contact the sample piece Q, the needle 18 is not cut when the needle 18 and the sample piece Q are separated by being irradiated with the focused ion beam in a later process. The configuration described above has a benefit in that it is possible to prevent the occurrence of problems such as damage caused by direct contact of the needle 18 with the sample piece Q. Even if, for example, the needle 18 vibrates, it is possible to suppress the transmission of the vibration to the sample piece Q. Even in a case in which movement of the sample piece Q occurs because of a creep phenomenon of the sample S, it is possible to suppress the occurrence of excessive strain between the needle 18 and the sample piece Q. FIG. 13 illustrates this state and is a diagram illustrating the processing frame R1 (the deposition film forming region) which contains the needle 18 and the connection processing position of the sample piece Q in image data which is obtained using a focused ion beam of the charged particle beam apparatus 10 according to the embodiment of the present invention, and FIG. 14 is an enlarged explanatory diagram of FIG. 13 and facilitates understanding of the positional relationship between the needle 18, the sample piece Q, and the deposition film forming region (for example, the processing frame R1). The needle 18 approaches a position having a distance of the predetermined distance L1 from the sample piece Q as a connection processing position, and stops. The needle 18, the sample piece Q, and the deposition film forming region (for example, the processing frame R1) are set to straddle the needle 18 and the sample piece Q. The deposition film is also formed at an interval of the predetermined distance L1, and the needle 18 and the sample piece Q are connected by the deposition film.

When connecting the needle 18 to the sample piece Q, the computer 22 subsequently assumes a connection posture corresponding to each of the approach modes which are selected in advance in step S010 when relocating the sample piece Q which is connected to the needle 18 to the sample piece holder P. The computer 22 adopts a relative connection posture between the needle 18 and the sample piece Q associated with each of a plurality of (for example, three) different approach modes to be described later.

The computer 22 may determine the connection state of the deposition film by detecting the change in the absorption current of the needle 18. When the absorption current of the needle 18 reaches a predefined current value, the computer 22 may determine that the sample piece Q and the needle 18 are connected by the deposition film, and regardless of whether or not a predetermined deposition time is elapsed, the formation of the deposition film may be stopped.

Figure 15:
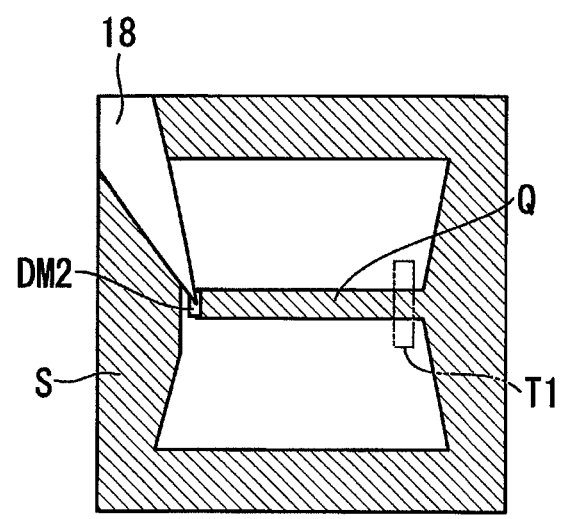
FIG. 15 is a diagram illustrating the sample and a cutting position of a support portion of the sample piece in an image which is obtained using a focused ion beam of the charged particle beam apparatus according to the embodiment of the present invention.

Next, the computer 22 performs a process of cutting the support portion Qa between the sample piece Q and the sample S (step S130). The computer 22 uses the reference mark Ref which is formed on the sample S to specify a preset cutting position T1 of the support portion Qa. The computer 22 separates the sample piece Q from the sample S by irradiating the cutting position T1 with the focused ion beam for a predetermined time. FIG. 15 is a diagram illustrating this state, and illustrates the sample S and the cutting position T1 of the support portion Qa of the sample piece Q in image data which is obtained using a focused ion beam of the charged particle beam apparatus 10 according to the embodiment of the present invention.

The computer 22 determines whether or not the sample piece Q is separated from the sample S by detecting conduction between the sample S and the needle 18 (step S133).

In a case in which conduction between the sample S and the needle 18 is not detected, the computer 22 determines that the sample piece Q is separated from the sample S (OK), and continues executing the subsequent processes. On the other hand, in a case in which the computer 22 detects conduction between the sample S and the needle 18 after the completion of the cutting process, that is, after the cutting of the support portion Qa between the sample piece Q and the sample S at the cutting position T1 is completed, the computer 22 determines that the sample piece Q is not separated from the sample S (NG). In a case in which the computer 22 determines that the sample piece Q is not separated from the sample S (NG), the computer 22 performs notification of a display on the display device 21 or a warning sound which indicates that the separation of the sample piece Q from the sample S is not completed (step S136). The computer 22 stops the execution of the following processes. In this case, the computer 22 may cut the deposition film DM1 which joins the sample piece Q to the needle 18 using focused ion beam irradiation, separate the sample piece Q from the needle 18, and return the needle 18 to the initial position (step S060). The needle 18 which returns to the initial position carries out the sampling of the next sample piece Q.

Figure 16:
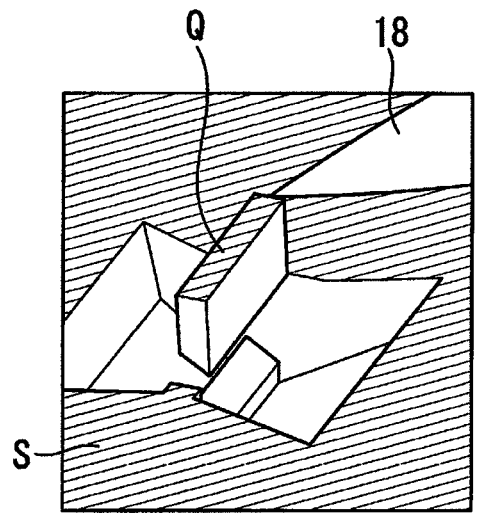
FIG. 16 is a diagram illustrating a state in which the needle to which the sample piece is connected is withdrawn in an image which is obtained using an electron beam of the charged particle beam apparatus according to the embodiment of the present invention.

Next, the computer 22 performs the process of withdrawing the needle (step S140). The computer 22 raises the needle 18 upward in the vertical direction (that is, in the positive direction of the Z direction) by a predetermined distance (for example, 5 μm) using the needle drive mechanism 19. FIG. 16 is a diagram illustrating this state, and illustrates a state in which the needle 18 to which the sample piece Q is connected is withdrawn in image data which is obtained using an electron beam of the charged particle beam apparatus 10 according to the embodiment of the present invention.

Figure 17:
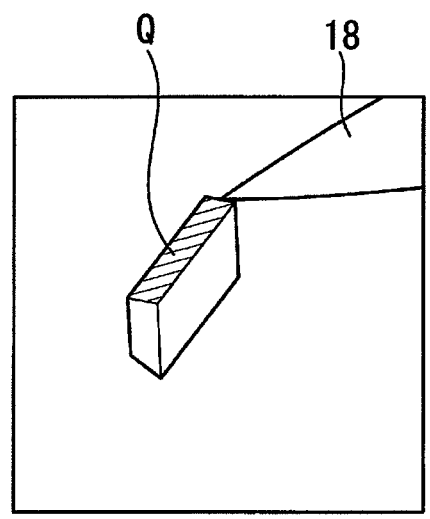
FIG. 17 is a diagram illustrating a state in which a stage is withdrawn in relation to the needle to which the sample piece is connected in an image which is obtained using an electron beam of the charged particle beam apparatus according to the embodiment of the present invention.

Next, the computer 22 performs the process of withdrawing the stage (step S150). As illustrated in FIG. 17, the computer 22 moves the stage 12 by a predetermined distance using the stage drive mechanism 13. For example, the computer 22 moves the stage downward in the vertical direction (that is, in the negative direction of the Z direction) by 1 mm, 3 mm, or 5 mm. After lowering the stage 12 by the predetermined distance, the computer 22 distances the nozzle 17a of the gas supply unit 17 from the stage 12. For example, the computer 22 raises the nozzle 17a to a standby position which is above the stage 12 in the vertical direction. FIG. 17 is a diagram illustrating this state, and illustrates a state in which the stage 12 is withdrawn in relation to the needle 18 to which the sample piece Q is connected in image data which is obtained using an electron beam of the charged particle beam apparatus 10 according to the embodiment of the present invention.

Next, the computer 22 operates the stage drive mechanism 13 such that a state is assumed in which there are no structures in the background of the needle 18 and the sample piece Q which are connected to each other. This is in order to reliably recognize the edges (the contours) of the needle 18 and the sample piece Q from the image data of the sample piece Q which is obtained by each of the focused ion beam and the electron beam when generating the template of the needle 18 and the sample piece Q in the subsequent process (steps). The computer 22 moves the stage 12 by the predetermined distance. The computer 22 determines the background of the sample piece Q (step S160), and advances to the next step S170 if there is no problem with the background, and if there is a problem with the background, the computer 22 moves the stage 12 by the predetermined amount again (step S165), returns to the determination of the background (step S160), and repeats until there is no longer a problem with the background.

The computer 22 executes the template creation of the needle and the sample piece (step S170). The computer 22 generates a template of the needle 18 and the sample piece Q in a posture state in which the needle 18 to which the sample piece Q is fixed is rotated as necessary (that is, a posture in which the sample piece Q is connected to the columnar portion 34 of the sample stage 33). Accordingly, the computer 22 three-dimensionally recognizes the edges (the contours) of the needle 18 and the sample piece Q from the image data which is obtained by each of the focused ion beam and the electron beam according to the rotation of the needle 18. The computer 22 may recognize the edges (the contours) of the needle 18 and the sample piece Q from the image data which is obtained using the focused ion beam without the electron beam being necessary in the approach mode in which a rotational angle of the needle 18 is 0°.

When the computer 22 instructs the stage drive mechanism 13 or the needle drive mechanism 19 to move the stage 12 to a position at which there are no structures in the background of the needle 18 and the sample piece Q, in a case in which the needle 18 does not reach the location which is actually instructed, the computer 22 sets the observation magnification to a low magnification and searches for the needle 18, and in a case in which the needle 18 is not found, the computer 22 initializes the position coordinates of the needle 18 and moves the needle 18 to the initial position.

In the template creation (step S170), first, the computer 22 acquires a template matching template (the reference image data) with respect to the sample piece Q and the tip shape of the needle 18 to which the sample piece Q is connected. The computer 22 irradiates the needle 18 with the charged particle beam (each of the focused ion beam and the electron beam) while scanning the irradiation position. The computer 22 acquires each item of image data from a plurality of different directions of the secondary charged particles R (secondary electrons and the like) which are emitted from the needle 18 using irradiation of the charged particle beam. The computer 22 acquires each item of image data using focused ion beam irradiation and electron beam irradiation. The computer 22 stores each item of image data which is acquired from two different directions as a template (reference image data).

Since the computer 22 uses the image data which is actually acquired for the sample piece Q and the needle 18 to which the sample piece Q which is actually processed by the focused ion beam is connected as the reference image data, it is possible to subject the sample piece Q and the needle 18 to precise pattern matching regardless of the shapes of the sample piece Q and the needle 18.

When acquiring each item of image data, the computer 22 uses image acquisition conditions such as suitable magnification, luminance, contrast, and the like which are stored in advance in order to increase the recognition precision of the shapes of the sample piece Q and the needle 18 to which the sample piece Q is connected.

Next, the computer 22 performs the process of withdrawing the needle (step S180). This is to prevent unintentional contact with the stage during the subsequent stage movement. The computer 22 moves the needle 18 by a predetermined distance using the needle drive mechanism 19. For example, the needle 18 is raised upward in the vertical direction (that is, in the positive direction of the Z direction). Conversely, the needle 18 is stopped on the spot and the stage 12 is moved by a predetermined distance. For example, the needle 18 may be lowered downward in the vertical direction (that is, in the negative direction of the Z direction). The needle withdrawing direction is not limited to the vertical direction which is described above but may be the needle axial direction, or another predetermined withdrawal position, and may be at a predefined position at which the sample piece Q which is attached to the tip of the needle does not come into contact with a structure inside the sample chamber and is not irradiated with the focused ion beam.

Figure 18:
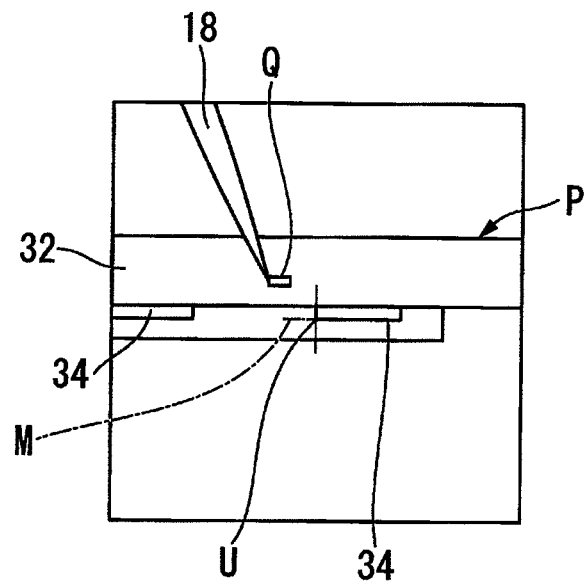
FIG. 18 is a diagram illustrating an attachment position of the sample piece of a columnar portion in an image which is obtained using a focused ion beam of the charged particle beam apparatus according to the embodiment of the present invention.
Figure 19:
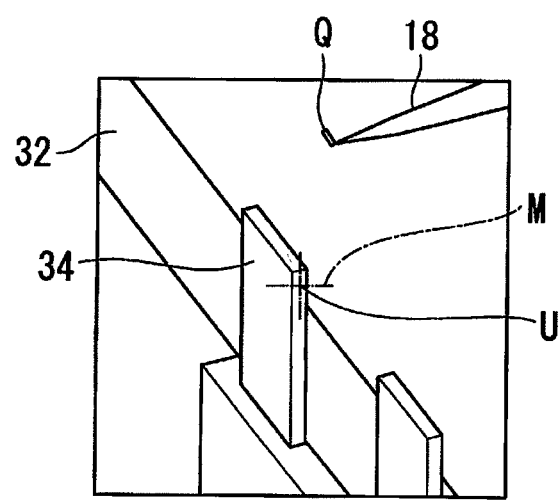
FIG. 19 is a diagram illustrating the attachment position of the sample piece of the columnar portion in an image which is obtained using an electron beam of the charged particle beam apparatus according to the embodiment of the present invention.

Next, the computer 22 moves the stage 12 using the stage drive mechanism 13 such that the specific sample piece holder P which is registered in the step S020 which is described above enters the observation visual field region of the charged particle beam (step S190). FIGS. 18 and 19 illustrate this state, and, in particular, FIG. 18 is a schematic diagram of an image which is obtained using a focused ion beam of the charged particle beam apparatus 10 according to the embodiment of the present invention and is a diagram illustrating an attachment position U of the sample piece Q of the columnar portion 34, and FIG. 19 is a schematic diagram of an image which is obtained using an electron beam, and is a diagram illustrating the attachment position U of the sample piece Q of the columnar portion 34.

Here, it is determined whether or not the columnar portion 34 of the desired sample piece holder P enters the observation visual field region (step S195), and if the desired columnar portion 34 enters the observation visual field region, the process advances to the next step S200. If the desired columnar portion 34 does not enter the observation visual field region, that is, in a case in which the stage driving does not operate correctly with respect to the specified coordinates, the stage coordinates which are specified directly before are initialized, and the stage 12 returns to the origin position (step S197). Again, the coordinates of the desired columnar portion 34 which are preregistered are specified, the stage 12 is driven (step S190), and the process is repeated until the columnar portion 34 enters the observation visual field region.

Next, the computer 22 adjusts the horizontal position of the sample piece holder P by moving the stage 12 using the stage drive mechanism 13, and rotates and tilts the stage 12 by an angle associated with the posture control mode such that the posture of the sample piece holder P becomes a predetermined posture (step S200).

According to step S200, it is possible to adjust the posture of the sample piece Q and the sample piece holder P to a relationship in which the front end surface of the original sample S is parallel or perpendicular to the end surface of the columnar portion 34. In particular, assuming that the sample piece Q which is fixed to the columnar portion 34 is thinned by the focused ion beam, it is preferable that the posture of the sample piece Q and the sample piece holder P is adjusted such that the surface end surface of the original sample S is in a perpendicular relationship with the focused ion beam irradiation axis. It is also preferable to adjust the posture of the sample piece Q and the sample piece holder P such that the sample piece Q which is fixed to the columnar portion 34 is on the downstream side of the focused ion beam in the incidence direction with the surface end surface of the original sample S perpendicular to the columnar portion 34.

Here, the quality of the shape of the columnar portion 34 in the sample piece holder P is determined (step S205). Although the image of the columnar portion 34 is registered in step S023, determining whether or not the specified columnar portion 34 is deformed, damaged, missing, or the like due to unexpected contact or the like in the subsequent processes, that is, determining the quality of the shape of the columnar portion 34 is step S205. In step S205, if it is determined that the shape of the columnar portion 34 is satisfactory with no problems, the process advances to the next step S210, and if it is determined that the shape of the columnar portion 34 is defective, the process returns to step S190 in which the stage is moved such that the next columnar portion 34 enters the observation visual field region.

When the computer 22 instructs the stage drive mechanism 13 to move the stage 12 in order to place the specified columnar portion 34 in the observation visual field region, in a case in which the specified columnar portion 34 does not actually enter the observation visual field region, the position coordinates of the stage 12 are initialized, and the stage 12 is moved to the initial position.

The computer 22 moves the nozzle 17a of the gas supply unit 17 to the vicinity of the irradiation position of the focused ion beam. For example, the computer 22 lowers the nozzle 17a from the standby position which is above the stage 12 in the vertical direction to a processing position.

Sample Piece Mounting Process

The "sample piece mounting process" referred to here is a process of relocating the sample piece Q which is picked up to the sample piece holder P.

FIG. 20 is a flowchart illustrating the flow of the process of mounting (relocating) the sample piece Q on the predetermined columnar portion 34 in the predetermined sample piece holder P among the operations of automatic sampling by the charged particle beam apparatus 10 according to the embodiment of the present invention.

The computer 22 recognizes the relocation position of the sample piece Q which is stored in step S020 which is described above using each item of image data which is obtained using the irradiation of a focused ion beam an electron beam (step S210). The computer 22 executes the template matching of the columnar portion 34. The computer 22 carries out the template matching in order to confirm that the columnar portion 34 that appears in the observation visual field region among the plurality of columnar portions 34 of the comb teeth shaped sample stage 33 is the columnar portion 34 which is specified in advance. The computer 22 carries out the template matching with each item of image data which is obtained by the irradiation of each of the focused ion beam and the electron beam using a template for each of the columnar portions 34 which is generated in the process (step S020) of generating the template of the columnar portion 34 in advance.

In step S215, the computer 22 determines whether or not a problem such as a the columnar portion 34 being missing or the like is recognized in the template matching for each of the columnar portions 34 which is carried out after moving the stage 12. In a case in which a problem is recognized in the shape of the columnar portion 34 (NG), the columnar portion 34 to which the sample piece Q is to be relocated is changed to the columnar portion 34 next to the columnar portion 34 in which a problem is recognized, and the template matching is performed on the columnar portion 34 to determine the columnar portion 34 to which to relocate the sample piece Q. If there is no problem in the shape of the columnar portion 34, the process transitions to the next step S220.

The computer 22 may extract edges (contours) from image data of a predetermined region (a region including at least the columnar portion 34), and may use this edge pattern as a template. In a case in which the edges (the contours) may not be extracted from the image data of the predetermined region (the region including at least the columnar portion 34), the computer 22 acquires the image data again. The extracted edges may be displayed on the display device 21, and template matching may be performed with an image using a focused ion beam or an electron beam in the observation visual field region.

The computer 22 drives the stage 12 using the stage drive mechanism 13 such that the attachment position which is recognized using the irradiation of the electron beam coincides with the attachment position which is recognized using the irradiation of the focused ion beam. The computer 22 drives the stage 12 using the stage drive mechanism 13 such that the attachment position U of the sample piece Q coincides with the visual field center (the processing position) of the visual field region.

Next, the computer 22 performs the processes of the following steps S220 to S250 as a process of causing the sample piece Q which is connected to the needle 18 to contact the sample piece holder P.

First, the computer 22 recognizes the position of the needle 18 (step S220). By irradiating the needle 18 with the charged particle beam, the computer 22 detects the absorption current flowing into the needle 18 and generates absorption current image data. The computer 22 acquires each item of image data using focused ion beam irradiation and electron beam irradiation. The computer 22 detects the tip position of the needle 18 in three-dimensional space using each item of absorption current image data from two different directions.

Using the detected tip position of the needle 18, the computer 22 may drive the stage 12 with the stage drive mechanism 13 to set the tip position of the needle 18 to the center position (the visual field center) of the preset visual field region.

Next, the computer 22 executes a sample piece mounting process. First, the computer 22 carries out the template matching in order to accurately recognize the position of the sample piece Q which is connected to the needle 18, and the computer 22 performs the template matching on each item of image data which is obtained using the irradiation of each of the focused ion beam and the electron beam, using the templates of the needle 18 and the sample piece Q which are connected to each other, the templates being generated in advance in the template creation process of the needle and sample piece.

The computer 22 displays the extracted edges on the display device 21 when extracting edges (contours) from a predetermined region (a region including at least the needle 18 and the sample piece Q) of the image data in the template matching. In a case in which the edges (the contours) may not be extracted from the predetermined region (the region including at least the needle 18 and the sample piece Q) of the image data in template matching, the computer 22 acquires the image data again.

In each item of image data which is obtained using the irradiation of each of the focused ion beam and the electron beam, the computer 22 measures the distance between the sample piece Q and the columnar portion 34 based on the template matching which uses the templates of the needle 18 and the sample piece Q which are connected to each other and the template of the columnar portion 34 which is the attachment target of the sample piece Q.

The computer 22 finally relocates the sample piece Q to the columnar portion 34 which is the attachment target of the sample piece Q using only movement within a plane which is parallel to the stage 12.

In the sample piece mounting process, first, the computer 22 executes a needle movement in which the needle 18 is moved by the needle drive mechanism 19 (step S230). In each item of image data which is obtained using the irradiation of each of the focused ion beam and the electron beam, the computer 22 measures the distance between the sample piece Q and the columnar portion 34 based on the template matching which uses the templates of the needle 18 and the sample piece Q and the template of the columnar portion 34. The computer 22 moves the needle 18 in three-dimensional space such that the needle 18 faces the attachment position of the sample piece Q according to the measured distance.

Next, the computer 22 stops the needle 18, leaving a predefined gap L2 between the columnar portion 34 and the sample piece Q (step S240). The computer 22 sets the gap L2 to less than or equal to 1 μm, and preferably sets the gap L2 to a range from 100 nm to 500 nm. Although it is possible to connect even in a case in which the gap L2 is greater than or equal to 500 μm, the time required for the connection between the columnar portion 34 and the sample piece Q by the deposition film is increased to greater than or equal to a predetermined value, and 1 μm is not preferable. As the gap L2 becomes smaller, the time required for the connection between the columnar portion 34 and the sample piece Q by the deposition film becomes shorter, but it is essential not to make contact.

When the gap L2 is provided, the computer 22 may detect the absorption current image of the columnar portion 34 and the needle 18 to provide a gap therebetween.

The computer 22 detects the conduction between the columnar portion 34 and the needle 18 or the absorption current image of the columnar portion 34 and the needle 18 to relocate the sample piece Q to the columnar portion 34, and subsequently detects the presence or absence of separation between the sample piece Q and the needle 18.

In a case in which the computer 22 may not detect the conduction between the columnar portion 34 and the needle 18, the computer 22 switches the process to detect the absorption current image of the columnar portion 34 and the needle 18.

In a case in which the computer 22 may not detect the conduction between the columnar portion 34 and the needle 18, the computer 22 may stop relocating the sample piece Q, separate the sample piece Q from the needle 18, and execute a needle trimming process which is described later.

Figure 21:
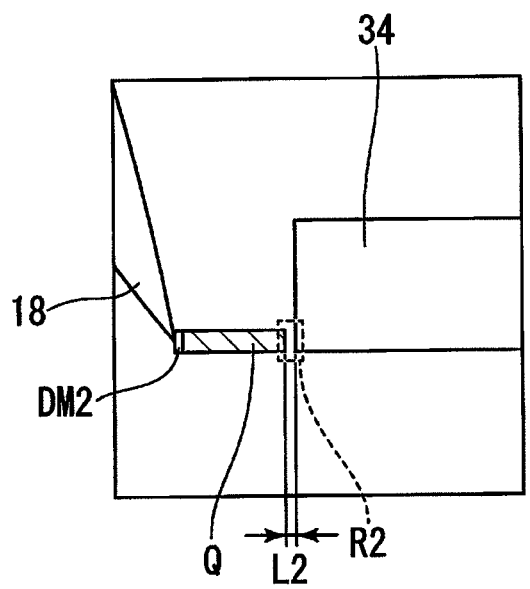
FIG. 21 is a diagram illustrating the needle, the movement of which is stopped in the periphery of the attachment position of the sample piece of the sample stage, in an image which is obtained using a focused ion beam of the charged particle beam apparatus according to the embodiment of the present invention.
Figure 22:
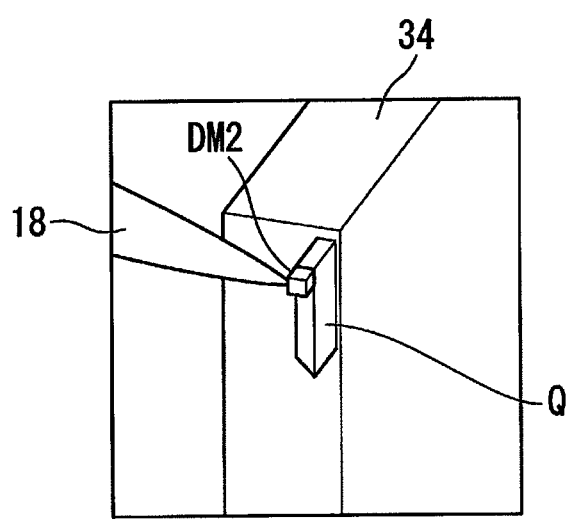
FIG. 22 is a diagram illustrating the needle, the movement of which is stopped in the periphery of the attachment position of the sample piece of a sample stage, in an image which is obtained using an electron beam of the charged particle beam apparatus according to the embodiment of the present invention.

Next, the computer 22 performs a process of connecting the sample piece Q to which the needle 18 is connected to the columnar portion 34 (step S250). FIGS. 21 and 22 are schematic diagrams of images which are obtained by increasing the observation magnification of FIGS. 18 and 19, respectively. The computer 22 causes the sample piece Q to approach the columnar portion 34 and stops the needle drive mechanism 19 when the gap L2 reaches a predetermined value such that a side of the sample piece Q and a side of the columnar portion 34 form a straight line as illustrated in FIG. 21, and such that the top end surface of the sample piece Q and the top end surface of the columnar portion 34 form the same surface as illustrated in FIG. 22. In a situation in which the sample piece Q stops at the attachment position of the sample piece Q with the gap L2, the computer 22 sets a processing frame R2 for deposition to include the end portion of the columnar portion 34 in the image which is obtained using the focused ion beam of FIG. 21. The computer 22 irradiates the irradiation region including the processing frame R2 with the focused ion beam for a predetermined time while supplying the gas to the surface of the sample piece Q and the columnar portion 34 using the gas supply unit 17. According to this operation, a deposition film is formed on the portion which is irradiated with the focused ion beam, the gap L2 is filled, and the sample piece Q is connected to the columnar portion 34. In the process of fixing the sample piece Q to the columnar portion 34 using deposition, the computer 22 completes the deposition in a case in which conduction between the columnar portion 34 and the needle 18 is detected.

The computer 22 determines that the connection between the sample piece Q and the columnar portion 34 is completed (step S255). Step S255 is performed as follows, for example. A resistance meter is installed between the needle 18 and the stage 12 in advance, and the conductivity between the sample piece Q and the columnar portion 34 is detected. The electrical resistance is infinite when the sample piece Q and the columnar portion 34 are separated (the gap L2 is present); however, the two are covered with a conductive deposition film, and the electrical resistance value therebetween gradually decreases as the gap L2 is filled, it is confirmed that the resistance reaches less than or equal to a predefined resistance value, and it is determined that the sample piece Q and the columnar portion 34 are electrically connected. From prior study, when the resistance value between the two reaches a predefined resistance value, it is possible to determine that the deposition film has sufficient mechanical strength and that the sample piece Q is sufficiently connected to the columnar portion 34.

The property being detected is not limited to the electrical resistance which is described above, and it may be capable of measuring the electrical characteristics between the columnar portion and the sample piece Q such as the current and the voltage. The computer 22 lengthens the formation time of the deposition film if the predefined electrical characteristics (the electrical resistance value, the current value, the potential, and the like) are not satisfied within a predefined time. The computer 22 is capable of obtaining, in advance, the time during which it is possible to form an optimum deposition film with respect to the gap L2 between the columnar portion 34 and the sample piece Q, the irradiation beam conditions, and the gas type for the deposition film, storing the deposition formation time, and stopping the formation of the deposition film in a predetermined time.

Figure 23:
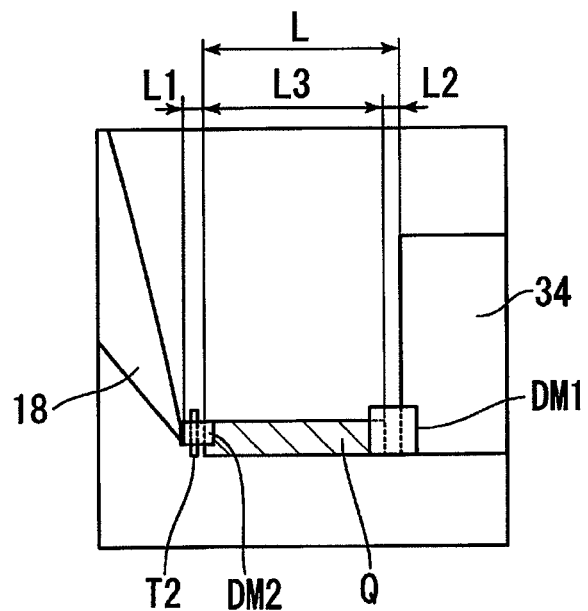
FIG. 23 is a diagram illustrating a processing frame for connecting the sample piece which is connected to the needle to the sample stage in an image which is obtained using a focused ion beam of the charged particle beam apparatus according to the embodiment of the present invention.

The computer 22 stops the gas supply and the focused ion beam irradiation when the connection between the sample piece Q and the columnar portion 34 is confirmed. FIG. 23 is a diagram illustrating this state, and illustrates the deposition film DM1 which connects the sample piece Q which is connected to the needle 18 to the columnar portion 34 in image data which is obtained using a focused ion beam of the charged particle beam apparatus 10 according to the embodiment of the present invention.

In step S255, the computer 22 may determine the connection state of the deposition film DM1 by detecting the change in the absorption current of the needle 18. In a case in which the computer 22 determines that the sample piece Q and the columnar portion 34 are connected by the deposition film DM1 according to the change in the absorption current of the needle 18, the computer 22 may stop the formation of the deposition film DM1 regardless of whether or not a predetermined time is elapsed. If the connection completion can be confirmed, the process transitions to the next step S260, and if the connection is not completed, the focused ion beam irradiation and the gas supply are stopped at a predefined time, and the deposition film DM2 which joins the sample piece Q and the needle 18 is cut by the focused ion beam, and the sample piece Q at the tip of the needle is discarded. The process transitions to an operation of withdrawing the needle (step S270).

Next, the computer 22 performs a process of separating the sample piece Q and the needle 18 by cutting the deposition film DM2 which connects the needle 18 and the sample piece Q (step S260). FIG. 23 is a diagram illustrating this state, and illustrates the cutting position T2 for cutting the deposition film DM2 which connects the needle 18 and the sample piece Q in image data which is obtained using a focused ion beam of the charged particle beam apparatus 10 according to the embodiment of the present invention. The computer 22 sets a position which is separated by the sum (L+L1/2) of the predetermined distance (that is, the sum of the gap L2 from the side surface of the columnar portion 34 to the sample piece Q and a size L3 of the sample piece Q) L from the side surface of the columnar portion 34 and half of the predetermined distance L1 (refer to FIG. 23) of the gap between the needle 18 and the sample piece Q as the cutting position T2. The cutting position T2 may be a position separated by the sum (L+L1) of the predetermined distance L and the predetermined distance L1 of the gap between the needle 18 and the sample piece Q. In this case, the deposition film DM 2 (the carbon deposition film) which remains at the tip of the needle becomes small, and chances to perform the cleaning (described later) work of the needle 18 become fewer, which is preferable for continuous automatic sampling.

Figure 24:
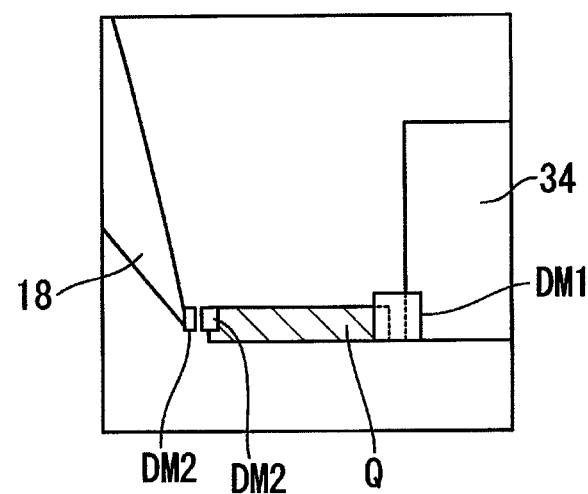
FIG. 24 is a diagram illustrating a cutting position for cutting a deposition film which connects the needle and the sample piece in an image which is obtained using a focused ion beam of the charged particle beam apparatus according to the embodiment of the present invention.

The computer 22 separates the needle 18 from the sample piece Q by irradiating the cutting position T2 with the focused ion beam for a predetermined time. The computer 22 cuts only the deposition film DM2 to separate the needle 18 from the sample piece Q without cutting the needle 18 by irradiating the cutting position T2 with the focused ion beam for a predetermined time. In step S260, it is important to cut only the deposition film DM2. Accordingly, since it is possible to repeatedly use the needle 18 which is set once for a long period without exchanging, it is possible to repeat the automatic sampling continuously unattended. FIG. 24 is a diagram illustrating this state, and illustrates a state in which the needle 18 is separated from the sample piece Q using the image data of a focused ion beam of the charged particle beam apparatus 10 according to the embodiment of the present invention. A residue of the deposition film DM2 is adhered to the tip of the needle.

The computer 22 determines whether or not the needle 18 is separated from the sample piece Q by detecting conduction between the sample piece holder P and the needle 18 (step S265). Even after completion of the cutting process, that is, even after performing the irradiation of the focused ion beam for a predetermined time in order to cut the deposition film DM 2 between the needle 18 and the sample piece Q at the cutting position T2, the computer 22 determines that the needle 18 is not separated from the sample stage 33 in a case in which the conduction between the sample piece holder P and the needle 18 is detected. In a case in which the computer 22 determines that the needle 18 is not separated from the sample piece holder P, the computer 22 notifies the operator by displaying on the display device 21 the fact that the separation between the needle 18 and the sample piece Q is not completed, or by using an alarm sound. The computer 22 stops the execution of the following processes. On the other hand, in a case in which conduction is not detected between the sample piece holder P and the needle 18, the computer 22 determines that the needle 18 is separated from the sample piece Q, and continues to execute the following processes.

Figure 25:
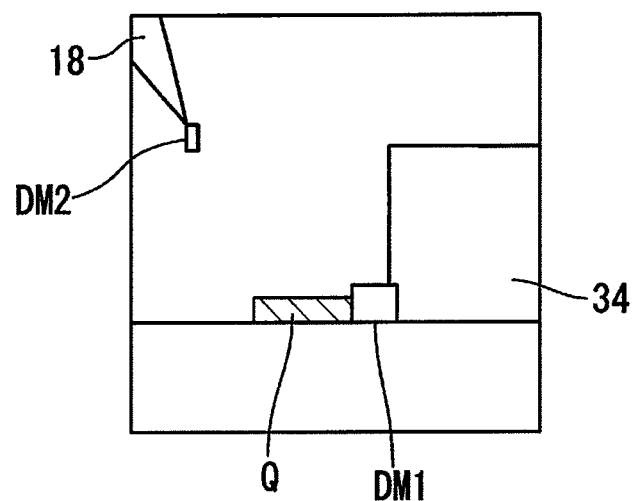
FIG. 25 is a diagram illustrating a state in which the needle is withdrawn in image data which is obtained using a focused ion beam of the charged particle beam apparatus according to the embodiment of the present invention.
Figure 26:
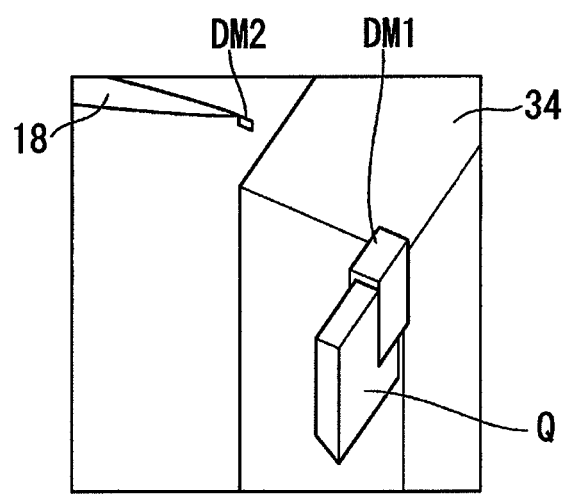
FIG. 26 is a diagram illustrating a state in which the needle is withdrawn in an image which is obtained using an electron beam of the charged particle beam apparatus according to the embodiment of the present invention.

Next, the computer 22 performs the process of withdrawing the needle (step S270). The computer 22 moves the needle 18 by a predetermined distance from the sample piece Q using the needle drive mechanism 19. For example, the needle 18 is raised upward in the vertical direction, that is, in the positive direction of the Z direction by 2 mm, 3 mm, or the like. FIGS. 25 and 26 illustrate this state, and are respectively a schematic diagram (FIG. 25) of an image which is obtained using the focused ion beam of the charged particle beam apparatus 10 according to the embodiment of the present invention and a schematic diagram (FIG. 26) of an image which is obtained using the electron beam illustrating a state in which the needle 18 is withdrawn upward from the sample piece Q.

Subsequently, it is determined whether or not to continue sampling from a different location of the same sample S (step S290). Since the setting of the number to be sampled is registered in advance in step S010, the computer 22 confirms the data and determines the next step. In a case in which the sampling is continued, the process returns to step S030, the following step S300 is continued, and the sampling work is executed, and in a case in which the sampling is not continued, the series flow is completed.

The creation of the template of the needle in step S050 may be performed directly after step S290. Accordingly, it is not necessary to prepare for the next sampling in step S050 during the next sampling and it is possible to simplify the process.

According to the above description, the series of automatic sampling operations is completed.

The above-described flow from the start to the end is merely an example, and steps may be exchanged or skipped if there is no obstacle to the overall flow.

The computer 22 is capable of executing the sampling operation unattended by continuously operating from the start to the end which is described above. According to the method which is described above, since it is possible to repeatedly perform the sample sampling without exchanging the needle 18, it is possible to continuously sample a large number of the sample pieces Q using the same needle 18.

Accordingly, the charged particle beam apparatus 10 is capable of repeatedly using the needle 18 without molding the same needle 18 and without exchanging the needle 18 itself when separating and picking up the sample piece Q from the sample S, and is capable of automatically preparing the large number of sample pieces Q from the single sample S. It is possible to execute the sampling without carrying out manual operation by an operator as in the related art.

As described above, according to the charged particle beam apparatus 10 according to the embodiment of the present invention, since the computer 22 controls the focused ion beam irradiation optical system 14, the electron beam irradiation optical system 15, the stage drive mechanism 13, the needle drive mechanism 19, and the gas supply unit 17 based on templates which are directly acquired from at least the sample piece holder P, the needle 18, and the sample piece Q, it is possible to appropriately automate the operation of relocating the sample piece Q to the sample piece holder P.

Since the template is generated from the secondary electron image or the absorption current image which is acquired using the irradiation of the charged particle beam in a state where there are no structures in the background of at least the sample piece holder P, the needle 18, and the sample piece Q, it is possible to improve the reliability of the templates. Accordingly, it is possible to improve the precision of template matching using the template, and it is possible to precisely relocate the sample piece Q to the sample piece holder P based on the positional information which is obtained using the template matching.

When performing instruction such that a state is assumed in which there are no structures in the background of at least the sample piece holder P, the needle 18, and the sample piece Q, in a case in which the reality is not in accordance with the instruction, since the positions of at least the sample piece holder P, the needle 18, and the sample piece Q are initialized, it is possible to return the drive mechanisms 13 and 19 to the normal state.

Since a template corresponding to the posture when the sample piece Q is relocated to the sample piece holder P is generated, it is possible to improve the positional precision at the time of relocation.

Since the mutual distances between the sample piece holder P, the needle 18, and the sample piece Q other are measured based on the template matching which uses at least the sample piece holder P, the needle 18, and the template of the sample piece Q, it is possible to further improve the positional precision at the time of relocation.

In a case in which the edges may not be extracted for a predetermined region in each item of image data of at least the sample piece holder P, the needle 18, and the sample piece Q, since the image data is acquired again, it is possible to accurately generate the template.

Since the sample piece Q is finally relocated to a predefined position of the sample piece holder P only by the movement in the plane which is parallel to the stage 12, it is possible to properly relocate the sample piece Q.

Since the sample piece Q which is held on the needle 18 is shaped before generating the template, it is possible to improve the precision of the edge extraction at the time of template creation, and it is possible to secure a shape of the sample piece Q which is suitable for finishing to be executed later. Since the position of the shaping is set according to the distance from the needle 18, it is possible to precisely carry out the shaping.

It is possible to compensate positional shifting of the needle 18 using eccentricity compensation when the needle 18 which holds the sample piece Q is rotated such that the needle 18 assumes a predetermined posture.

According to the charged particle beam apparatus 10 according to the embodiment of the present invention, by detecting the relative position of the needle 18 to the reference mark Ref when the sample piece Q is formed, the computer 22 is capable of ascertaining the relative positional relationship of the needle 18 to the sample piece Q. By sequentially detecting the relative position of the needle 18 to the position of the sample piece Q, the computer 22 is capable of appropriately driving the needle 18 in three-dimensional space (that is, without contacting other members, equipment, and the like).

By using the image data which is acquired from at least two different directions, the computer 22 is capable of precisely ascertaining the position of the needle 18 in three-dimensional space. The computer 22 is capable of appropriately and three-dimensionally driving the needle 18.

Since the image data which is actually generated directly before the needle 18 is moved in advance is used as a template (reference image data), the computer 22 is capable of performing template matching with a high matching precision regardless of the shape of the needle 18. Accordingly, the computer 22 is capable of precisely ascertaining the position of the needle 18 in three-dimensional space, and is capable of appropriately driving the needle 18 in three-dimensional space. Since the computer 22 causes the stage 12 to withdraw and acquires each item of image data or absorption current image data in a state in which there are no complicated structures in the background of the needle 18, it is possible to acquire a template from which it is possible to clearly ascertain the shape of the needle 18 excluding the influence of the background.

Since the needle 18 and the sample piece Q are connected using the deposition film without allowing the needle 18 to contact the sample piece Q, the computer 22 is capable of preventing the needle 18 from being cut when the needle 18 and the sample piece Q are separated from each other in a later process. Even in a case in which vibrations are generated in the needle 18, it is possible to suppress the transmission of the vibrations to the sample piece Q. Even in a case in which the movement of the sample piece Q occurs because of the creep phenomenon of the sample S, it is possible to suppress the occurrence of excessive strain between the needle 18 and the sample piece Q.

In a case in which the connection between the sample S and the sample piece Q is cut by a sputtering process using the irradiation of the focused ion beam, the computer 22 is capable of determining whether or not the cutting is actually completed by detecting whether or not there is conduction between the sample S and the needle 18.

Since the computer 22 performs notification of the fact that the actual separation of the sample S and the sample piece Q is not completed, even in a case in which the execution of the series of processes which are automatically executed continuing from this process is suspended, it is possible to allow the operator of the apparatus to easily recognize the cause of the suspension.

In a case in which the computer 22 does not detect conductivity between the sample S and the needle 18, the computer 22 determines that the connection cutting between the sample S and the sample piece Q is not actually completed, and cuts the connection between the sample piece Q and the needle 18 in preparation for the driving of the withdrawal or the like of the needle 18 continuing from this process. Accordingly, the computer 22 is capable of preventing the occurrence of problems such as positional shifting of the sample S and damage to the needle 18 which accompany the driving of the needle 18.

The computer 22 is capable of detecting whether or not there is conductivity between the sample piece Q and the needle 18, confirming that the connection cutting between the sample S and the sample piece Q is actually completed, and subsequently driving the needle 18. Accordingly, the computer 22 is capable of preventing the occurrence of problems such as positional shifting of the sample piece Q and damage to the needle 18 or the sample piece Q which accompany the driving of the needle 18.

Since the computer 22 uses the actual image data as a template in relation to the needle 18 to which the sample piece Q is connected, the computer 22 is capable of performing template matching with high matching precision regardless of the shape of the needle 18 to which the sample piece Q is connected. Accordingly, the computer 22 is capable of precisely ascertaining the position of the needle 18 to which the sample piece Q is connected in three-dimensional space, and is capable of appropriately driving the needle 18 and the sample piece Q in three-dimensional space.

Since the computer 22 extracts the position of a plurality of the columnar portions 34 which configure the sample stage 33 using the template of the sample stage 33 which is already known, the computer 22 is capable of confirming whether or not the sample stage 33 which is in an appropriate state is present before the driving of the needle 18.

The computer 22 is capable of indirectly and precisely ascertaining the fact that the needle 18 and the sample piece Q reach the vicinity of the movement target position corresponding to a change in the absorption current before and after the needle 18 to which the sample piece Q is connected reaches the inside of the irradiation region. Accordingly, the computer 22 is capable of stopping the needle 18 and the sample piece Q without causing the needle 18 and the sample piece Q to come into contact with another member such as the sample stage 33 which is present at the movement target position, and is capable of preventing the occurrence of problems such as damage caused by contact.

In a case in which the sample piece Q and the sample stage 33 are connected using the deposition film, since the computer 22 detects whether or not there is conduction between the sample stage 33 and the needle 18, the computer 22 is capable of precisely confirming whether or not the connection of the sample piece Q and the sample stage 33 is actually completed.

The computer 22 is capable of detecting whether or not there is conductivity between the sample stage 33 and the needle 18, confirming that the connection between the sample stage 33 and the sample piece Q is actually completed, and subsequently cutting the connection between the sample piece Q and the needle 18.

By matching the actual shape of the needle 18 to an ideal reference shape, the computer 22 is capable of easily recognizing the needle 18 using pattern matching, when driving the needle 18 in three-dimensional space, and it is possible to accurately detect the position of the needle 18 in three-dimensional space.

Hereinafter, description will be given of a first modification example of the embodiment which is described above.

In the embodiment which is described above, since the needle 18 does not receive the irradiation of a focused ion beam, is not reduced in size, and is not deformed, the tip of the needle is not molded and the needle 18 is not exchanged; however, the computer 22 may execute elimination processing (referred to as cleaning of the needle 18 in the present specification) of the carbon deposition film on the tip of the needle at an appropriate timing of a case in which the operations of the automatic sampling are repeatedly executed, for example, the number of times of the repeated execution is for a predefined number of times. For example, the cleaning is performed once every 10 times the automatic sampling is performed. Hereinafter, description will be given of the determination method of carrying out the cleaning of the needle 18.

As a first method, first, a secondary electron image of the tip of the needle is acquired using the irradiation of an electron beam directly before carrying out the automatic sampling, or periodically, at a position without at which there are no complicated structures in the background. With the secondary electron image, it is possible to clearly confirm to the carbon deposition film which is adhered to the tip of the needle. The secondary electron image is stored in the computer 22.

Next, the absorption current image of the needle 18 is acquired in the same visual field at the same observation magnification without moving the needle 18. With the absorption current image, the carbon deposition film may not be confirmed, and only the shape of the needle 18 may be confirmed. The absorption current image is also stored in the computer 22.

Here, by subtracting the absorption current image from the secondary electron image, the needle 18 is erased, and the shape of the carbon deposition film which protrudes from the tip of the needle is manifested. The carbon deposition film is cleaned using the irradiation of a focused ion beam such that the needle 18 is not cut when the area of the manifested carbon deposition film exceeds a predefined area. At this time, the carbon deposition film may remain if the area of the remaining carbon deposition film is less than or equal to the predefined area.

Next, as the second method, a time at which, instead of the area of the manifested carbon deposition film, the length of the carbon deposition film in the axial direction (the longitudinal direction) of the needle 18 exceeds a predefined length may be determined to be the time at which to perform the cleaning of the needle 18.

As a third method, the coordinates in the image of the tip of the carbon deposition film in the secondary electron image which is stored in the computer are recorded. The coordinates in the image of the tip of the needle in the absorption current image which is stored in the computer 22 are stored. Here, it is possible to calculate the length of the carbon deposition film from the tip coordinates of the carbon deposition film and the tip coordinates of the needle 18. The computer 22 may determine a time at which the length exceeds a predefined value as the time at which to perform the cleaning of the needle 18.

As a fourth method, a template is generated of the tip shape of the needle including the carbon deposition film which is thought to be optimal in advance, the template is superposed on the secondary electron image of the tip of the needle after repeatedly performing the sampling a plurality of times, and the portions which protrude from the template may be removed using a focused ion beam.

As a fifth method, a time at which, instead of the area of the manifested carbon deposition film, the thickness of the carbon deposition film on the tip of the needle 18 exceeds a predefined thickness may be determined to be the time at which to perform the cleaning of the needle 18.

These cleaning methods may be performed directly after step S280 in FIG. 20, for example.

In a case in which the cleaning is carried out using the methods which are described above but the predefined shape is not achieved even by the cleaning, in a case in which the cleaning may not be performed within a predefined time, or every predefined period, the needle 18 may be exchanged. Even after exchanging the needle 18, the process flow which is described above is not changed, and in the same manner as described above, the steps such as saving the tip shape of the needle are executed.

Hereinafter, description will be given of a second modification example of the embodiment which is described above.

In the embodiment which is described above, the needle drive mechanism 19 is provided integrally with the stage 12; however, the configuration is not limited thereto. The needle drive mechanism 19 may be provided independently of the stage 12. The needle drive mechanism 19 may be provided independently from tilt driving or the like of the stage 12 by being fixed to the sample chamber 11 or the like, for example.

Hereinafter, description will be given of a third modification example of the embodiment which is described above.

In the embodiment which is described above, the optical axis of the focused ion beam irradiation optical system 14 is set to the vertical direction, and the optical axis of the electron beam irradiation optical system 15 is set to a direction which is tilted in relation to vertical; however, the configuration is not limited thereto. For example, the optical axis of the focused ion beam irradiation optical system 14 may be set to a direction which is tilted in relation to vertical, and the optical axis of the electron beam irradiation optical system 15 may be set to the vertical direction.

Hereinafter, description will be given of a fourth modification example of the embodiment which is described above.

In the embodiment which is described above, a configuration is adopted in which the irradiation of two types of beam of the focused ion beam irradiation optical system 14 and the electron beam irradiation optical system 15 is possible for the charged particle beam irradiation optical system; however, the configuration is not limited thereto. For example, a configuration may be adopted in which the electron beam irradiation optical system 15 is absent, and only the focused ion beam irradiation optical system 14 is installed in the vertical direction. Negatively charged ions are used for the ions which are used in this case.

In the embodiment which is described above, in several of the steps which are described above, the sample piece holder P, the needle 18, the sample piece Q, and the like are irradiated with the electron beam and the focused ion beam from different directions, images are acquired using the electron beam and the focused ion beam, and the positions and positional relationships of the sample piece holder P, the needle 18, the sample piece Q, and the like are ascertained; however, this may be performed by mounting only the focused ion beam irradiation optical system 14, using only the image of the focused ion beam. Hereinafter, description will be given of this example.

For example, in step S220, in a case in which the positional relationship between the sample piece holder P and the sample piece Q is ascertained, in a case in which the tilting of the stage 12 is horizontal, or alternatively, in a case in which the stage 12 is tilted from horizontal by a specific tilt angle, it is possible to acquire an image using the focused ion beam such that both the sample piece holder P and the sample piece Q enter the same visual field, and to ascertain the three-dimensional positional relationship between the sample piece holder P and the sample piece Q from the images thereof. As described above, since the needle drive mechanism 19 is capable of horizontal and vertical movement, and tilting integrally with the stage 12, the relative positional relationship between the sample piece holder P and the sample piece Q is held regardless of whether the stage 12 is horizontal or tilted. Therefore, even if the charged particle beam irradiation optical system is only the single focused ion beam irradiation optical system 14, it is possible to observe and process the sample piece Q from two different directions.

In, the same manner, the registration of the image data of the sample piece holder P in step S020, the recognition of the position of the needle in step S040, the acquisition of the template of the needle (the reference image) in step S050, the acquisition of the reference image of the needle 18 to which the sample piece Q is connected in step S170, the recognition of the attachment position of the sample piece Q in step S210, and the stopping of the movement of the needle in step S250 may be performed in the same manner.

Even in the connection between the sample piece Q and the sample piece holder P in step S250, the deposition film may be formed on the top end surfaces of the sample piece holder P and the sample piece Q with the stage 12 in a horizontal state, the sample piece holder P may be connected to the sample piece Q, the stage 12 may be tilted, the deposition film may be formed from different directions, and a reliable connection is achieved.

Hereinafter, description will be given of a fifth modification example of the embodiment which is described above.

In the embodiment which is described above, the computer 22 automatically executes the series of processes of step S010 to step S280 as the operations of the automatic sampling; however, the configuration is not limited thereto. The computer 22 may switch at least one of the processes of step S010 to step S280 to being executed by the manual operation of an operator.

In a case in which the computer 22 executes the operation of automatically sampling a plurality of the sample pieces Q, every time any one of a plurality of the sample pieces Q, directly before being picked up, is formed in the sample S, the computer 22 may execute the operation of automatically sampling the sample piece Q which is the one directly before being picked up. The computer 22 may continuously execute the operation of automatically sampling each of the plurality of sample pieces Q directly before being picked up after all of the plurality of sample pieces Q, directly before being picked up, are formed in the sample S.

Hereinafter, description will be given of a sixth modification example of the embodiment which is described above.

In the embodiment described above, the computer 22 extracts the position of the columnar portion 34 using the template of a known columnar portion 34; however, a reference pattern which is generated from the actual image data of a columnar portion 34 in advance may be used as the template. The computer 22 may use a pattern, which is generated during the execution of the automatic processing in which the sample stage 33 is formed, as the template.

In the embodiment described above, the computer 22 may ascertain the relative relationship of the position of the needle 18 to the position of the sample stage 33 using the reference mark Ref which is formed by the irradiation of the charged particle beam during the creation of the columnar portion 34. By sequentially detecting the relative position of the needle 18 to the position of the sample stage 33, the computer 22 is capable of appropriately driving the needle 18 in three-dimensional space (that is, without contacting other members, equipment, and the like).

Hereinafter, description will be given of a seventh modification example of the embodiment which is described above.

In the embodiment which is described above, the processes from step S220 to step S250 which cause the sample piece Q to be connected to the sample piece holder P may be performed as follows. In other words, the processes of operating the needle drive mechanism 19 such that the positional relationship (the mutual distance) between the columnar portion 34 and the sample piece Q of the sample piece holder P is obtained from the image thereof, and the distance between the columnar portion 34 and the sample piece Q becomes the target value.

Figure 27:
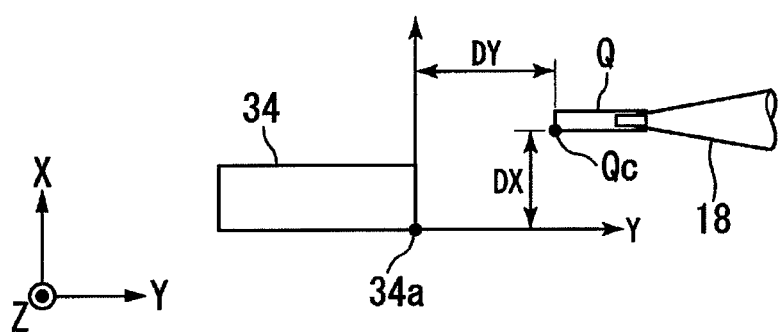
FIG. 27 is an explanatory diagram illustrating the positional relationship between the columnar portion and the sample piece based on an image which is obtained using focused ion beam irradiation in the charged particle beam apparatus according to the embodiment of the present invention.
Figure 28:
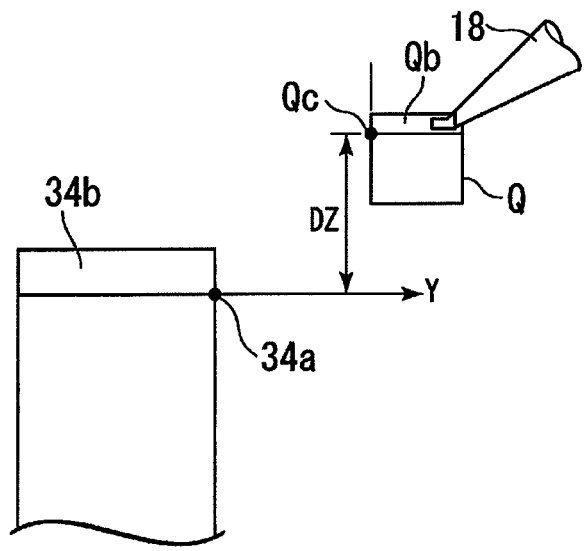
FIG. 28 is an explanatory diagram illustrating the positional relationship between the columnar portion and the sample piece based on an image which is obtained using electron beam irradiation in the charged particle beam apparatus according to the embodiment of the present invention.

In step S220, the computer 22 recognizes the positional relationships between the needle 18, the sample piece Q, and the columnar portion 34 from secondary particle image data or absorption current image data which are obtained using the electron beam and the focused ion beam. FIGS. 27 and 28 are diagrams schematically illustrating the positional relationship between the columnar portion 34 and the sample piece Q. FIG. 27 is based on an image which is obtained using irradiation of the focused ion beam, and FIG. 28 is based on an image which is obtained using irradiation of the electron beam. The relative positional relationship between the columnar portion 34 and the sample piece Q is measured from these diagrams. As illustrated in FIG. 27, orthogonal triaxial coordinates (different coordinates from the triaxial coordinates of the stage 12) are defined using a corner (for example, a side surface 34a) of the columnar portion 34 as an origin, and distances DX and DY are measured from FIG. 27 as distances of the side surface 34a (the origin) of the columnar portion 34 and a reference point Qc of the sample piece Q.

Meanwhile, a distance DZ is obtained from FIG. 28. However, when tilted by an angle $\theta$ (where $0° < \theta \leq 90°$) in relation to the electron beam optical axis and the focused ion beam axis (vertical), the actual distance in the Z axis direction between the columnar portion 34 and the sample piece Q is DZ/sin $\theta$.

Next, description will be given of the movement stopping positional relationship of the sample piece Q to the columnar portion 34 using FIGS. 27 and 28.

A positional relationship is assumed in which a top end surface 34b of the columnar portion 34 and a top end surface Qb of the sample piece Q are set to the same surface, the side surface of the columnar portion 34 and the cross-section of the sample piece Q are the same surface, and there is a gap of approximately 0.5 µm between the columnar portion 34 and the sample piece Q. In other words, it is possible to cause the sample piece Q to reach the target stopping position by operating the needle drive mechanism 19 such that DX=0, DY=0.5 µm, and DZ=0.

In a configuration in which the optical axis of the electron beam and the optical axis of the focused ion beam are in a perpendicular ($\theta$=90°) relationship, the measured value of the distance DZ between the columnar portion 34 and the sample piece Q which is measured using the electron beam is the actual distance between the two.

Hereinafter, description will be given of an eighth modification example of the embodiment which is described above.

In the embodiment which is described above, in step S230, the needle drive mechanism 19 is operated such that the interval, which is measured from the image, between the columnar portion 34 and the sample piece Q becomes the target value.

In the embodiment which is described above, the processes from step S220 to step S250 which cause the sample piece Q to be connected to the sample piece holder P may be performed as follows. In other words, the processes predefine the attachment position of the sample piece Q to the columnar portion 34 of the sample piece holder P as a template, subject the image of the sample piece Q to pattern matching at the attachment position, and operate the needle drive mechanism 19.

Description is given of a template indicating the movement stopping positional relationship of the sample piece Q to the columnar portion 34. The positional relationship is such that the top end surface 34b of the columnar portion 34 and the top end surface Qb of the sample piece Q are set to the same surface, the side surface of the columnar portion 34 and the cross-section of the sample piece Q are the same surface, and there is a gap of approximately 0.5 µm between the columnar portion 34 and the sample piece Q. For the template, a line drawing may be generated by extracting contour (edge) portions from a secondary particle image or absorption current image data of the actual sample piece holder P or the needle 18 to which the sample piece Q is adhered, and may be generates as a line drawing from a design drawing or a CAD drawing.

By displaying the columnar portion 34 of the generated template in an overlapping manner with the image of the columnar portion 34 which is obtained using the electron beam and the focused ion beam in real time, and giving operation instructions to the needle drive mechanism 19, the sample piece Q moves toward the stopping position of the sample piece Q in the template (steps S230 and S240). It is confirmed that the image which is obtained in real time using the electron beam and the focused ion beam overlaps the stopping position of the sample piece Q in the predefined template, and the stopping process of the needle drive mechanism 19 is performed (step S250). In this manner, it is possible to accurately move the sample piece Q to a stopping positional relationship with the columnar portion 34 which is predefined.

Figure 29:
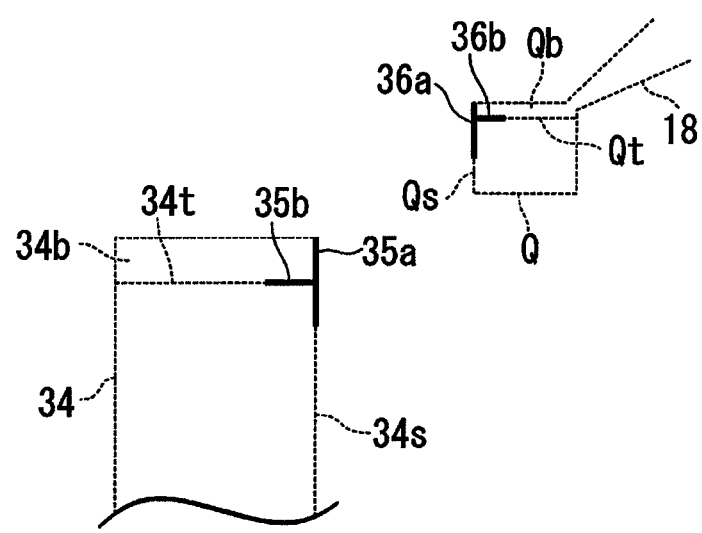
FIG. 29 is an explanatory diagram illustrating a template which uses an edge between the columnar portion and the sample piece based on an image which is obtained using electron beam irradiation in the charged particle beam apparatus according to the embodiment of the present invention.
Figure 30:
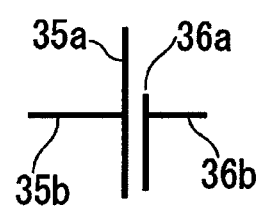
FIG. 30 is a explanatory diagram which explaining a template illustrating the positional relationship between the columnar portion and the sample piece when connecting the columnar portion and the sample piece to each other in the charged particle beam apparatus according to the embodiment of the present invention.

The following may be performed as another form of the above-described processes from step S230 to step S250. The line drawing of the edge portions which are extracted from the secondary particle image and the absorption current image data is limited to only the minimum portions which are necessary for the alignment of the sample piece Q and the columnar portion 34. FIG. 29 illustrates an example thereof, and illustrates the contour lines (dotted line display) of the columnar portion 34 and the sample piece Q, and the extracted edges (bold line display). The edges to be focused on of the columnar portion 34 and the sample piece Q are edges 34s and Qs facing each other and portions of edges 34t and Qt of the top end surfaces 34b and Qb of the columnar portion 34 and the sample piece Q. It is sufficient for each of the line segments to be a portion of each of the edges, line segments 35a and 35b for the columnar portion 34, and line segments 36a and 36b for the sample piece Q. A T-shaped template is generated, for example, from the line segments. By operating the stage drive mechanism 13 and the needle drive mechanism 19, the associated template moves. From the mutual positional relationships between the line segments 35a, 35b, 36a, and 36b, it is possible to ascertain the gap between the columnar portion 34 and the sample piece Q, the parallelism, and the heights of the two, and it is possible to easily align the columnar portion 34 and the sample piece Q. FIG. 30 is in the positional relationship of a template associated with the predefined positional relationship between the columnar portion 34 and the sample piece Q, and is in a positional relationship in which the line segments 35a and 36a are parallel with a predefined interval, and the line segments 35b and 36b are on a single straight line. At least one of the stage drive mechanism 13 and the needle drive mechanism 19 is operated, and the drive mechanisms which are operating stop when the template assumes the positional relationship of FIG. 30.

In this manner, it is possible to use the template in the precise alignment after confirming that the sample piece Q is approaching the predetermined columnar portion 34.

Next, description will be given of another example in steps S220 to S250 which are described above, as a ninth modification example of the embodiment which is described above.

In step S230 in the embodiment which is described above, the needle 18 is moved. In a case in which the sample piece Q having finished step S230 is in a positional relationship greatly shifted from the target position, the following operation may be performed.

In step S220, it is desirable that the position of the sample piece Q before the movement is in a region of Y>0, Z>0 in the orthogonal triaxial coordinate system using each of the columnar portions 34 as the origin. This is because the possibility of collision of the sample piece Q with the columnar portion 34 is extremely small during the movement of the needle 18, and it is possible to operate the X, Y, and Z drive units of the needle drive mechanism 19 simultaneously to safely and swiftly reach the target position. On the other hand, in a case in which the position of the sample piece Q before the movement is in the region of Y<0, when the X, Y, and Z drive units of the needle drive mechanism 19 are simultaneously operated with the sample piece Q facing the stopping position, the sample piece Q is highly likely to collide with the columnar portion 34. Therefore, in a case in which the sample piece Q is in the region of Y<0 in step S220, the needle 18 is caused to reach the target position by a path avoiding the columnar portion 34. Specifically, first, the needle drive mechanism 19 is driven in only the Y axis, the sample piece Q is moved to a predetermined position (for example, a position two times, three times, five times, 10 times, or the like the width of the columnar portion 34 being focused on), is moved to the region of Y>0, and the sample piece Q is moved toward the final stopping position by the simultaneous operation of the X, Y, and Z drive units. According to this step, it is possible to safely and swiftly move the sample piece Q without the sample piece Q colliding with the columnar portion 34. In a case in which, by some chance, it is confirmed from the electron beam image and/or the focused ion beam image that the X coordinates of the sample piece Q and the columnar portion 34 are the same and the Z coordinates are in a position which is lower than the top end of the columnar portion (Z<0), first, the sample piece Q is moved to a Z>0 region (for example, the position of Z=2 µm, 3 µm, 5 µm, 10 µm), next, the sample piece Q is moved to a predetermined position of the region of Y>0, and next, the sample piece Q is moved toward the final stopping position by the simultaneous operation of the X, Y, and Z drive units. By moving the sample piece Q in this manner, it is possible to cause the sample piece Q to reach the target position without the sample piece Q and the columnar portion 34 colliding with each other.

Next, description will be given of a tenth modification example of the embodiment which is described above.

In the charged particle beam apparatus 10 according to the present invention, it is possible to axially rotate the needle 18 using the needle drive mechanism 19. In the embodiment which is described above, description is given of the most basic sampling procedure which does not use axial rotation of the needle 18 excluding needle trimming; however, in the twelfth modification example, description is given of an embodiment which uses the axial rotation of the needle 18.

Since the computer 22 is capable of operating the needle drive mechanism 19 and axially rotating the needle 18, the computer 22 is capable of executing posture control of the sample piece Q as necessary. The computer 22 rotates the sample piece Q which is picked up from the sample S, and fixes the sample piece Q to the sample piece holder P in a state in which the sample piece Q is vertically or horizontally changed. The computer 22 fixes the sample piece Q such that the surface of the original sample S in the sample piece Q is in a perpendicular positional relationship or a parallel positional relationship with the end surface of the columnar portion 34. Accordingly, the computer 22 is capable of securing a posture of the sample piece Q which is suitable for the finishing which is to be subsequently executed, for example, and is capable of reducing the influence of a curtain effect (a processed fringe pattern which occurs in the irradiation direction of the focused ion beam which gives erroneous interpretation in a case in which the completed sample piece is observed with an electron microscope) which arises during the thinning finishing of the sample piece Q. When the needle 18 is rotated, the computer 22 performs eccentricity compensation to compensate the rotation such that the sample piece Q does not shift from the real visual field.

The computer 22 performs the shaping of the sample piece Q using the irradiation of the focused ion beam as necessary. In particular, it is desirable that the shaped sample piece Q is shaped such that the end surface in contact with the columnar portion 34 is substantially parallel to the end surface of the columnar portion 34. The computer 22 performs shaping such as cutting a portion of the sample piece Q before generating a template to be described later. The computer 22 sets the processing position of the shaping with reference to the distance from the needle 18. Accordingly, the computer 22 facilitates edge extraction from a template to be described later, and secures a shape of the sample piece Q which is suitable for the finishing to be executed later.

Continuing from step S150 which is described above, in the posture control, first, the computer 22 drives the needle 18 using the needle drive mechanism 19, and rotates the needle 18 by an angle associated with the posture control mode such that the posture of the sample piece Q becomes a predetermined posture. Here, the posture control mode is a mode in which the sample piece Q is controlled to assume a predetermined posture, and the posture of the sample piece Q is controlled by causing the needle 18 to approach the sample piece Q at a predetermined angle, rotating the needle 18 to which the sample piece Q is connected by a predetermined angle. The computer 22 performs eccentricity compensation when rotating the needle 18. FIGS. 31 to 36 are diagrams illustrating this state, and illustrate a state of the needle 18 to which the sample piece Q is connected in each of a plurality (for example, three) of different approach modes.

Figure 31:
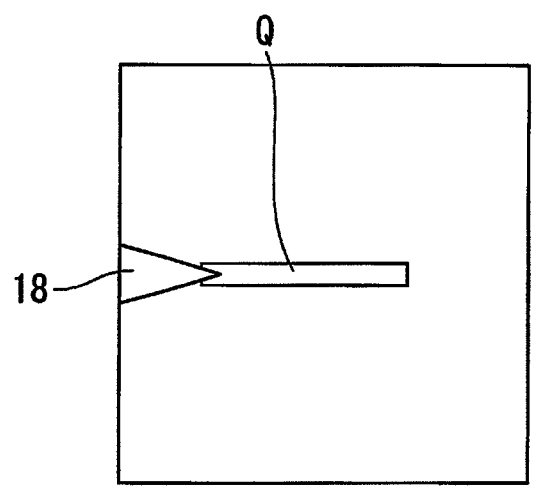
FIG. 31 is a diagram illustrating a state of an approach mode where a rotational angle of the needle to which the sample piece is connected is 0° in image data which is obtained using a focused ion beam of the charged particle beam apparatus according to the embodiment of the present invention.
Figure 32:
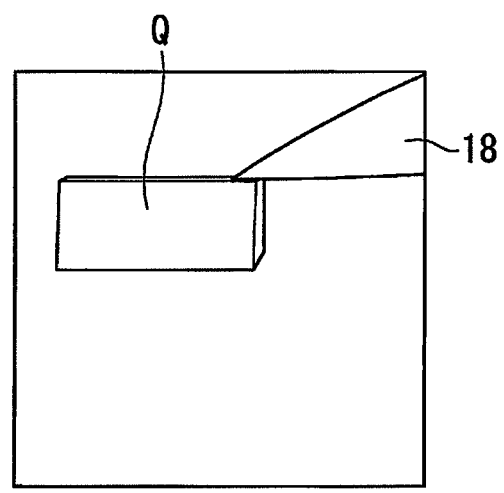
FIG. 32 is a diagram illustrating a state of an approach mode where the rotational angle of the needle to which the sample piece is connected is 0° in an image which is obtained using an electron beam of the charged particle beam apparatus according to the embodiment of the present invention.

FIGS. 31 and 32 are diagrams illustrating, in an approach mode in which the rotational angle of the needle 18 is 0°, a state (FIG. 31) of the needle 18 to which the sample piece Q is connected in image data which is obtained using a focused ion beam of the charged particle beam apparatus 10 according to the embodiment of the present invention, and a state (FIG. 32) of the needle 18 to which the sample piece Q is connected in image data which is obtained using an electron beam of the charged particle beam apparatus 10 according to the embodiment of the present invention. In the approach mode in which the rotational angle of the needle 18 is 0°, the computer 22 sets a posture state which is suitable for relocating the sample piece Q to the sample piece holder P without rotating the needle 18.

Figure 33:
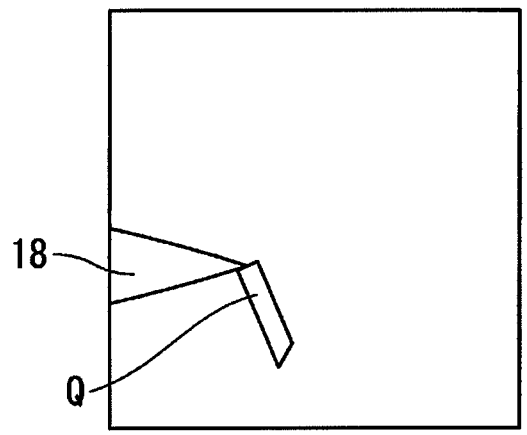
FIG. 33 is a diagram illustrating a state of an approach mode where the rotational angle of the needle to which the sample piece is connected is 90° in an image which is obtained using a focused ion beam of the charged particle beam apparatus according to the embodiment of the present invention.
Figure 34:
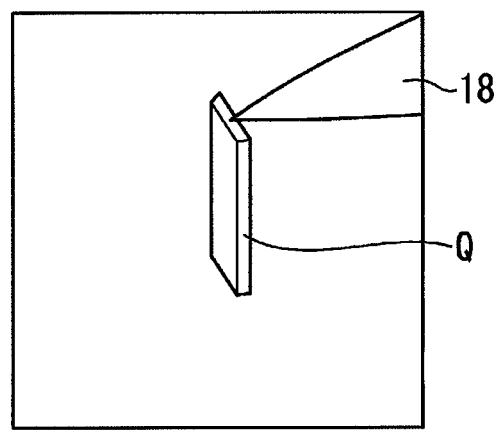
FIG. 34 is a diagram illustrating a state of an approach mode where the rotational angle of the needle to which the sample piece is connected is 90° in an image which is obtained using an electron beam of the charged particle beam apparatus according to the embodiment of the present invention.

FIGS. 33 and 34 are diagrams illustrating, in an approach mode in which the rotational angle of the needle 18 is 90°, a state (FIG. 33) in which the needle 18 to which the sample piece Q is connected in image data which is obtained using a focused ion beam of the charged particle beam apparatus 10 according to the embodiment of the present invention is rotated by 90°, and a state (FIG. 34) in which the needle 18 to which the sample piece Q is connected in image data which is obtained using an electron beam of the charged particle beam apparatus 10 according to the embodiment of the present invention is rotated by 90°. In the approach mode in which the rotational angle of the needle 18 is 90°, the computer 22 sets a posture state which is suitable for relocating the sample piece Q to the sample piece holder P in a state in which the needle 18 is rotated by 90°.

Figure 35:
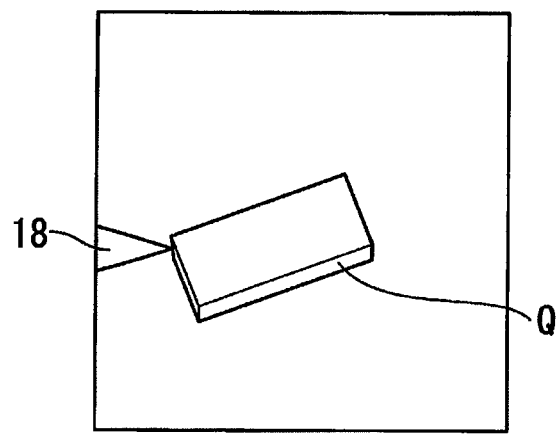
FIG. 35 is a diagram illustrating a state of an approach mode where the rotational angle of the needle to which the sample piece is connected is 180° in an image which is obtained using a focused ion beam of the charged particle beam apparatus according to the embodiment of the present invention.
Figure 36:
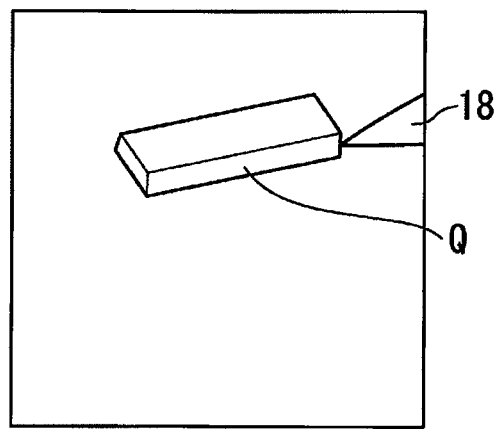
FIG. 36 is a diagram illustrating a state of an approach mode where the rotational angle of the needle to which the sample piece is connected is 180° in an image which is obtained using an electron beam of the charged particle beam apparatus according to the embodiment of the present invention.

FIGS. 35 and 36 are diagrams illustrating, in an approach mode in which the rotational angle of the needle 18 is 180°, a state (FIG. 35) in which the needle 18 to which the sample piece Q is connected in image data which is obtained using a focused ion beam of the charged particle beam apparatus 10 according to the embodiment of the present invention is rotated by 180°, and a state (FIG. 36) in which the needle 18 to which the sample piece Q is connected in image data which is obtained using an electron beam of the charged particle beam apparatus 10 according to the embodiment of the present invention is rotated by 180°. In the approach mode in which the rotational angle of the needle 18 is 180°, the computer 22 sets a posture state which is suitable for relocating the sample piece Q to the sample piece holder P in a state in which the needle 18 is rotated by 180°.

The relative connection posture between the needle 18 and the sample piece Q is set to a connection posture which is suitable for each of the approach modes when connecting the needle 18 to the sample piece Q in the sample piece pickup process which is already described above.

Next, description will be given of an eleventh modification example of the embodiment which is described above.

In the eleventh modification example, in the charged particle beam apparatus 10, description is given of an embodiment in which the flat sample is prepared using the fact it is possible to axially rotate the needle 18 using the needle drive mechanism 19.

The flat sample refers to a sample piece which is thinned such that the sample piece which is separated and picked up is parallel to the surface of the original sample in order to observe the inner portion of the sample, which is a surface parallel to the sample surface.

Figure 37:
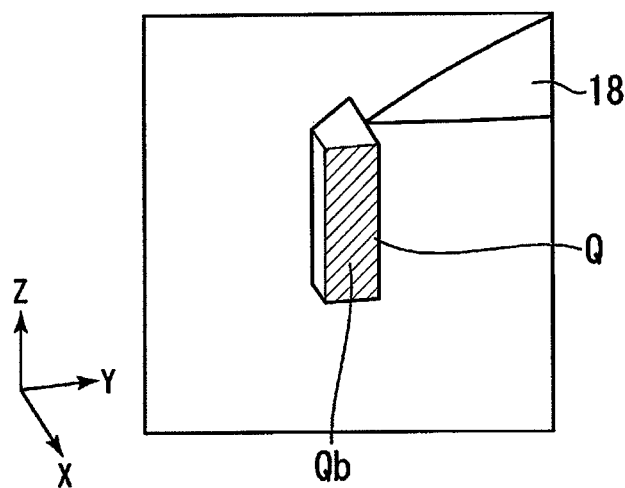
FIG. 37 is an explanatory diagram for preparing a flat sample according to the embodiment of the present invention, and is a diagram illustrating a state of an approach mode where the rotational angle of the needle to which the sample piece is connected is 90° in an image which is obtained using a focused ion beam of the charged particle beam apparatus of the present invention.

FIG. 37 is a diagram illustrating a state in which the sample piece Q which is separated and picked up is fixed to the tip of the needle 18, and schematically illustrates an image which is obtained using an electron beam. The fixing of the needle 18 to the sample piece Q is fixed using the method illustrated in FIGS. 5 to 8. In a case in which the rotational axis of the needle 18 is set to a position which is tilted by 45° in relation to (the XY plane of FIG. 1), the top end surface Qb of the sample piece Q which is separated and picked up is posture controlled to a surface perpendicular to the XY plane from the horizontal surface (the XY plane of FIG. 1) by rotating the needle 18 by 90°.

Figure 38:
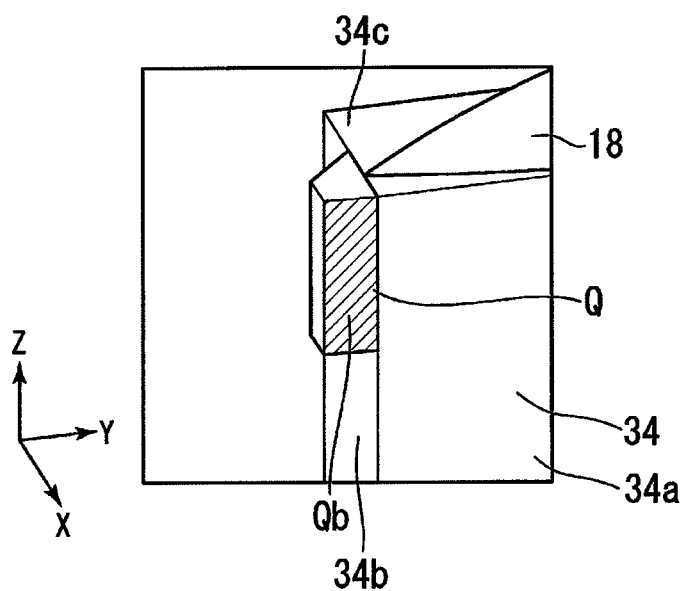
FIG. 38 is an explanatory diagram for preparing a flat sample according to the embodiment of the present invention, and is a diagram illustrating a state in which a separated sample piece is in contact with the sample piece holder.

FIG. 38 is a diagram illustrating a state in which the sample piece Q which is fixed to the tip of the needle 18 is moved so as to come into contact with the columnar portion 34 of the sample piece holder P. The side surface 34a of the columnar portion 34 is a surface which has a positional relationship which is perpendicular to the irradiation direction of the electron beam when finally observing the side surface 34a using a transmission electron microscope, and on the other hand, the side surface 34b is a surface which has a positional relationship which is parallel to the irradiation direction of the electron beam. The side surface (a top end surface 34c) of the columnar portion 34 is a surface which has a positional relationship which is perpendicular to the irradiation direction of the focused ion beam in FIG. 1, and is the top end surface of the columnar portion 34.

The top end surface Qb of the sample piece Q which is posture controlled by the needle is moved to become parallel to the side surface 34a of the columnar portion 34 of the sample piece holder P, more desirably, to become the same surface, and the cross-section of the sample piece is bought into surface contact with the sample piece holder. After confirming that the sample piece is in contact with the sample piece holder, a deposition film is formed on the top end surface 34c of the columnar portion 34 to be applied to the sample piece and the sample piece holder at the contact portions of the sample piece and the sample piece holder.

Figure 39:
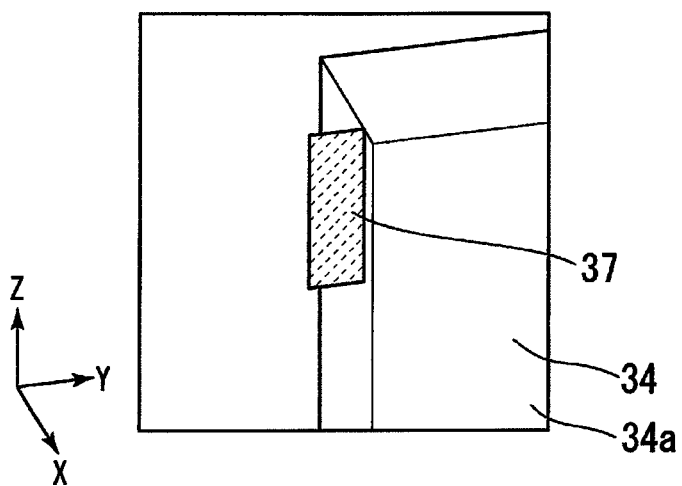
FIG. 39 is an explanatory diagram for preparing a flat sample according to the embodiment of the present invention, and is a diagram illustrating a state in which a sample piece which is fixed to a sample piece holder is thinned to prepare a flat sample.

FIG. 39 is a schematic diagram illustrating a state in which a flat sample 37 is prepared by irradiating the sample piece Q which is fixed to the sample piece holder with a focused ion beam. The flat sample 37 which has a predefined sample depth from the sample surface is obtained from the distance from the top end surface Qb of the sample piece Q, and the flat sample is prepared using the irradiation of the focused ion beam parallel to the top end surface Qb of the sample piece Q such that the predefined thickness is obtained. According to the flat sample, it is possible to ascertain the structure and composition distribution of the inner portion of the sample parallel to the sample surface.

The preparation method of the flat sample is not limited thereto, and if the sample piece holder is mounted on a mechanism which is capable of tilting in a range of 0° to 90°, it is possible to prepare the flat sample without rotating the probe using the rotation of the sample stage and the tilting of the sample piece holder. In a case in which the tilt angle of the needle is in a range from 0° to 90° other than 45°, it is also possible to prepare the flat sample by appropriately defining the tilt angle of the sample piece holder.

In this manner, it is possible to prepare the flat sample, and it is possible to observe the surface which is parallel to the sample surface and is a predetermined depth using an electron microscope.

In the present example, the sample piece which is picked up and separated is used as the side surface of the columnar portion. It is conceivable to fix the sample piece to the top end portion of the columnar portion; however, since the focused ion beam hits the top end portion of the columnar portion during the thinning process of the sample by the focused ion beam and the sputtered particles which are emitted from the location adhere to the thinned portion and a sample piece which is inappropriate for microscopic observation is obtained, it is desirable to fix the sample piece to the side surface.

Hereinafter, description will be given of other embodiments.

(a1)

A charged particle beam apparatus which automatically prepares a sample piece from a sample includes at least a plurality of charged particle beam irradiation optical systems (beam irradiation optical systems) which perform irradiation of charged particle beams, a sample stage on which the sample is placed and which moves, a sample piece relocation unit for transporting the sample piece, the sample piece relocation unit including a needle which connects to the sample piece which is separated and picked up from the sample, a holder fixing stage which holds a sample piece holder including a columnar portion to which the sample piece is relocated, a gas supply unit which supplies a gas which forms a deposition film using irradiation of the charged particle beam, and a computer which measures electrical characteristics between the sample piece and the columnar portion, and controls at least the charged particle beam irradiation optical system, the sample piece relocation unit, and the gas supply unit such that the deposition film which straddles the sample piece and the columnar portion which are static with a gap provided to the columnar portion is formed to reach a predefined electrical characteristic value.

(a2)

A charged particle beam apparatus which automatically prepares a sample piece from a sample includes at least a plurality of charged particle beam irradiation optical systems (beam irradiation optical systems) which perform irradiation of charged particle beams, a sample stage on which the sample is placed and which moves, a sample piece relocation unit for transporting the sample piece, the sample piece relocation unit including a needle which connects to the sample piece which is separated and picked up from the sample, a holder fixing stage which holds a sample piece holder including a columnar portion to which the sample piece is relocated, a gas supply unit which supplies a gas which forms a deposition film using irradiation of the charged particle beam, and a computer which measures electrical characteristics between the sample piece and the columnar portion, and controls at least the charged particle beam irradiation optical system, the sample piece relocation unit, and the gas supply unit such that the deposition film which straddles the sample piece and the columnar portion which are static with a gap provided to the columnar portion is formed for a predefined time.

(a3)

A charged particle beam apparatus which automatically prepares a sample piece from a sample includes at least a focused ion beam irradiation optical system (a beam irradiation optical system) which performs irradiation of a focused ion beam, a sample stage on which the sample is placed and which moves, a sample piece relocation unit for transporting the sample piece, the sample piece relocation unit including a needle which connects to the sample piece which is separated and picked up from the sample, a holder fixing stage which holds a sample piece holder including a columnar portion to which the sample piece is relocated, a gas supply unit which supplies a gas which forms a deposition film using irradiation of the focused ion beam, and a computer which measures electrical characteristics between the sample piece and the columnar portion, and controls at least the focused ion beam irradiation optical system, the sample piece relocation unit, and the gas supply unit such that the deposition film which straddles the sample piece and the columnar portion which are static with a gap provided to the columnar portion is formed to reach a predefined electrical characteristic value.

(a4)

A charged particle beam apparatus which automatically prepares a sample piece from a sample includes at least a focused ion beam irradiation optical system (a beam irradiation optical system) which performs irradiation of a focused ion beam, a sample stage on which the sample is placed and which moves, a sample piece relocation unit for transporting the sample piece, the sample piece relocation unit including a needle which connects to the sample piece which is separated and picked up from the sample, a holder fixing stage which holds a sample piece holder including a columnar portion to which the sample piece is relocated, a gas supply unit which supplies a gas which forms a deposition film using irradiation of the focused ion beam, and a computer which measures electrical characteristics between the sample piece and the columnar portion, and controls at least the focused ion beam irradiation optical system, the sample piece relocation unit, and the gas supply unit such that the deposition film which straddles the sample piece and the columnar portion which are static with a gap provided to the columnar portion is formed for a predefined time.

(a5)

In the charged particle beam apparatus according to (a1) or (a2) which are described above, the charged particle beams include at least a focused ion beam and an electron beam.

(a6)

In the charged particle beam apparatus according to (a1) to (a4) which are described above, the electrical characteristics are at least one of electrical resistance, current, and potential.

(a7)

In the charged particle beam apparatus according to any one of (a1) to (a6) which are described above, the computer controls at least the beam irradiation optical system, the sample piece relocation unit, and the gas supply unit such that in a case in which the electrical characteristics between the sample piece and the columnar portion do not satisfy the predefined electrical characteristics within the predefined formation time of the deposition film, the sample piece is moved such that the gap between the columnar portion and the sample piece is further reduced and the deposition film which straddles the sample piece and the columnar portion which are static is formed.

(a8)

In the charged particle beam apparatus according to any one of (a1) to (a6) which are described above, the computer controls at least the beam irradiation optical system and the gas supply unit such that in a case in which the electrical characteristics between the sample piece and the columnar portion satisfy the predefined electrical characteristics within the predefined formation time of the deposition film, the formation of the deposition film is stopped.

(a9)

In the charged particle beam apparatus according to (a1) or (a3) which are described above, the gap is less than or equal to 1 µm.

(a10)

In the charged particle beam apparatus according to (a9) which is described above, the gap is 100 nm to 200 nm.

A charged particle beam apparatus which automatically prepares a sample piece from a sample includes a charged particle beam irradiation optical system (a beam irradiation optical system) which performs irradiation of a charged particle beam, a sample stage on which the sample is placed and which moves, a sample piece relocation unit for holding and transporting the sample piece which is separated and picked up from the sample, a holder fixing stage which holds a sample piece holder including a columnar portion to which the sample piece is relocated, and a computer which generates a template of the columnar portion based on an image of the columnar portion which is acquired using irradiation of the charged particle beam, and controls the charged particle beam irradiation optical system and the sample piece relocation unit so as to relocate the sample piece to the columnar portion based on positional information which is obtained through template matching which uses the template.

(b2)

In the charged particle beam apparatus according to (b1) which is described above, the sample piece holder is provided with a plurality of the columnar portions which are disposed to be spaced apart, and the computer generates each of the templates of the plurality of columnar portions based on each of the images of the plurality of columnar portions.

(b3)

In the charged particle beam apparatus according to (b2) which is described above, the computer performs a determination process of determining whether or not the shape of the columnar portion which is the target among the plurality of columnar portions matches a predetermined shape which is registered in advance using template matching which uses each of the templates of the plurality of columnar portions, and in a case in which the shape of the columnar portion which is the target does not match the predetermined shape, the columnar portion which is the target is newly switched to another columnar portion and the determination process is performed, and in a case in which the shape of the columnar portion which is the target matches the predetermined shape, the computer controls the charged particle beam irradiation optical system, and the movement of the sample piece relocation unit or the sample stage so as to relocate the sample piece to the columnar portion.

(b4)

In the charged particle beam apparatus according to (b2) or (b3) which are described above, when the computer controls the movement of the sample stage such that the columnar portion which is a target among the plurality of columnar portions is disposed in a predetermined position, the computer initializes the position of the sample stage in a case in which the columnar portion which is the target is not disposed in the predetermined position.

(b5)

In the charged particle beam apparatus according to (b4) which is described above, when the computer controls the movement of the sample stage such that the columnar portion which is a target among the plurality of columnar portions is disposed in a predetermined position, the computer performs a shape determination process of determining whether or not there is a problem in the shape of the columnar portion which is the target after the movement of the sample stage, and in a case in which there is a problem in the shape of the columnar portion which is the target, the computer newly switches the columnar portion which is the target to another of the columnar portions and controls the movement of the sample stage such that the columnar portion is disposed in the predetermined position, and the computer performs the shape determination process.

(b6)

In the charged particle beam apparatus according to any one of (b1) to (b5) which are described above, the computer generates a template of the columnar portion before separating and picking up the sample piece from the sample.

(b7)

In the charged particle beam apparatus according to (b3) which is described above, the computer stores each of the images of the plurality of columnar portions, edge information which is extracted from the images, or each item of design information of the plurality of columnar portions as the template, and determines whether or not the shape of the columnar portion which is the target matches the predetermined shape using a score of template matching which uses the template.

(b8)

In the charged particle beam apparatus according to any one of (b1) to (b7) which are described above, the computer stores an image which is acquired using the irradiation of the charged particle beam on the columnar portion to which the sample piece is relocated, and the positional information of the columnar portion to which the sample piece is relocated.

(c1)

A charged particle beam apparatus which automatically prepares a sample piece from a sample includes a charged particle beam irradiation optical system which performs irradiation of a charged particle beam, a sample stage on which the sample is placed and which moves, a sample piece relocation unit for holding and transporting the sample piece which is separated and picked up from the sample, a holder fixing stage which holds a sample piece holder including a columnar portion to which the sample piece is relocated, a gas supply unit which supplies a gas which forms a deposition film using irradiation of the charged particle beam, and a computer which controls the charged particle beam irradiation optical system and the sample piece relocation unit such that the deposition film which is adhered to the sample piece relocation unit is irradiated with the charged particle beam after the sample piece relocation unit is separated from the sample piece.

(c2)

In the charged particle beam apparatus according to (c1) which is described above, the sample piece relocation unit holds and transports the sample piece which is separated and picked up from the sample repeatedly over a plurality of times.

(c3)

In the charged particle beam apparatus according to (c1) or (c2) which are described above, the computer controls the charged particle beam irradiation optical system and the sample piece relocation unit to irradiate the deposition film which is adhered to the sample piece relocation unit with the charged particle beam repeatedly at predetermined timings including at least the timing of every time the sample piece relocation unit is separated from the sample piece.

(c4)

In the charged particle beam apparatus according to any one of (c1) to (c3) which are described above, when the computer controls the movement of the sample piece relocation unit such that the sample piece relocation unit which is separated from the sample piece is disposed in a predetermined position, the computer initializes the position of the sample piece relocation unit in a case in which the sample piece relocation unit is not disposed in the predetermined position.

(c5)

In the charged particle beam apparatus according to (c4) which is described above, in a case in which the sample piece relocation unit is not disposed in the predetermined position even if the computer controls the movement of the sample piece relocation unit after the position of the sample piece relocation unit is initialized, the computer stops controlling the sample piece relocation unit.

(c6)

In the charged particle beam apparatus according to any one of (c1) to (c5) which are described above, the computer generates a template of the sample piece relocation unit based on an image which is acquired using the irradiation of the charged particle beam on the sample piece relocation unit before connecting the sample piece relocation unit to the sample piece, and based on contour information which is obtained through template matching which uses the template, the computer controls the charged particle beam irradiation optical system and the sample piece relocation unit to irradiate the deposition film which is adhered to the sample piece relocation unit with the charged particle beam.

(c7)

In the charged particle beam apparatus according to (c6) which is described above, there is provided a display device which displays the contour information.

(c8)

In the charged particle beam apparatus according to any one of (c1) to (c7) which are described above, the computer performs eccentric compensation when rotating the sample piece relocation unit around the center axis such that the sample piece relocation unit assumes a predetermined posture.

(c9)

In the charged particle beam apparatus according to any one of (c1) to (c8) which are described above, the sample piece relocation unit is provided with a needle or a pincer which connects to the sample piece.

In the embodiments which are described above, the computer 22 includes software function units or hardware function units such as an LSI.

In the embodiments which are described above, description is given exemplifying the needle 18 with a needle-shaped member which has a sharpened tip; however, the tip may be a shape such as a flat chisel shape.

It is possible to apply the present invention to a case in which at least the sample piece Q to be picked up is configured from carbon. According to the present invention, it is possible to use the template and the tip position coordinates to move the needle 18 to a desired position. In other words, when relocating the sample piece Q which is picked up to the sample piece holder P in a state of being fixed to the tip of the needle 18, it is possible to control the needle 18 to which the sample piece Q is attached such that the sample piece Q approaches the sample piece holder P with a predetermined gap therebetween and stops using the true tip coordinates (the tip coordinates of the sample piece Q) which are acquired from the secondary electron image which is obtained using the irradiation of the charged particle beam, and a template of the needle 18 which is formed from the absorption current image of the needle 18 to which the sample piece Q is attached.

It is possible to apply the present invention to other apparatuses. For example, in a charged particle beam apparatus which performs measurement using a probe which is provided with a carbon nanotube on the tip of a tungsten probe for contacting a conductive portion of a fine region, it is not possible to recognize the tip of the tungsten probe for the background such as a wiring pattern in an ordinary secondary electron image. The charged particle beam apparatus causes a probe to make contact and performs measurement, and in particular, is a device which is equipped with a metal probe in a sample chamber of a scanning electron microscope which uses an electron beam among the charged particle beams. Although it is possible to facilitate the recognition of the tungsten probe using the absorption current image, the tip of the carbon nanotube may not be recognized, and it is not possible to cause the carbon nanotube to make contact with the measurement point, which is critical. Therefore, in the present invention, by specifying the true tip coordinates of the needle 18 using the secondary electron image and using a method of generating a template using the absorption current image, it is possible to move the probe to which the carbon nanotube is attached to a specific measurement position and come into contact.

The sample piece Q which is prepared by the charged particle beam apparatus 10 according to the present invention which is described above may be introduced to a different focused ion beam apparatus, and may be processed under careful operation of an apparatus operator until the sample piece Q is a suitable thinness for transmission electron microscope analysis. In this manner, by coordinating the charged particle beam apparatus 10 and the focused ion beam apparatus according to the present invention, it is possible to fix a large number of sample pieces Q to the sample piece holder P unattended at nighttime, and an apparatus operator may carefully finish the sample piece Q as an ultrathin transmission electron microscopy sample at daytime. Therefore, the burden on the body and mind to the apparatus operator is greatly reduced as compared with the related art in which a series of operations from the sample pickup to the thinning process rely on operation by the apparatus operator with one apparatus, and work efficiency is improved.

The embodiments which are described above have been presented by way of example only, and are not intended to limit the scope of the invention. The novel embodiments described herein may be embodied in a variety of other forms, and various omissions, substitutions and changes may be made without departing from the spirit of the invention. The embodiments and modifications thereof are included in the scope and spirit of the invention, and are included in the scope of the invention which is described in the claims and equivalents to the invention.

For example, in the charged particle beam apparatus 10 according to the present invention, description is given of the needle 18 for picking up the sample piece Q; however, the configuration is not limited thereto, and an alternative of the needle may be a pincer which performs fine operations. By using a pincer, it is possible to pick up the sample piece Q without performing deposition, and there is no concern of wear to the tip or the like. Even in a case in which the needle 18 is used, the connection to the sample piece Q is not limited to deposition, and the needle 18 may be caused to contact the sample piece Q in a state in which an electrostatic force is applied to the needle 18, and the connection between the sample piece Q and the needle 18 may be performed through electrostatic adherence.

What is claimed is:

1. A charged particle beam apparatus which automatically prepares a sample piece from a sample, the charged particle beam apparatus comprising:
   a charged particle beam irradiation optical system configured to perform irradiation of a charged particle beam;
   a sample stage configured to move, the sample being placed on the sample stage;
   a sample piece relocation unit configured to hold and transport the sample piece which is separated and picked up from the sample;
   a holder fixing stage which holds a sample piece holder to which the sample piece is relocated; and
   a computer which performs positional control in relation to a target object based on a template and positional information which is obtained from an image of the target object, the template being generated based on an absorption current image of the target object which is acquired using the irradiation of the charged particle beam.

2. The charged particle beam apparatus according to claim 1, wherein
   the sample piece relocation unit includes a needle configured to hold and transport the sample piece which is separated and picked up from the sample, and a needle drive mechanism configured to drive the needle, and
   the computer controls the needle drive mechanism to control a position of the needle which is the target object in relation to the sample piece.

3. The charged particle beam apparatus according to claim 2, further comprising:
   a gas supply unit configured to irradiate a gas for forming a deposition film using the irradiation of the charged particle beam,
   wherein the computer controls the charged particle beam irradiation optical system, the needle drive mechanism, and the gas supply unit to cause the needle to approach the sample piece leaving a gap between the needle and the sample piece, and to connect the needle to the sample piece through the deposition film.

4. The charged particle beam apparatus according to claim 3, wherein a gap between the needle and the sample piece in which the deposition film is formed is less than or equal to 1 µm.

5. The charged particle beam apparatus according to claim 4, wherein the gap between the needle and the sample piece in which the deposition film is formed is 100 nm to 400 nm.

6. The charged particle beam apparatus according to claim 2, wherein
   the computer controls the needle drive mechanism to cause the needle to approach the sample piece using a template and tip coordinates,
   the template is formed using an absorption current image which is obtained by irradiating the needle with the charged particle beam, and
   the tip coordinates of the needle are acquired from the absorption current image which is obtained by irradiating the needle with the charged particle beam.

7. The charged particle beam apparatus according to claim 1, wherein
   the sample piece relocation unit is provided with a needle configured to hold and transport the sample piece which is separated and picked up from the sample, and a needle drive mechanism configured to drive the needle,
   the sample piece holder includes a columnar portion to which the sample piece is relocated, and
   the computer controls the needle drive mechanism to control a position of the sample piece in relation to the columnar portion which is the target object.

* * * * *